United States Patent
Ware

(10) Patent No.: US 10,254,331 B2
(45) Date of Patent: Apr. 9, 2019

(54) METHODS AND APPARATUS FOR TESTING INACCESSIBLE INTERFACE CIRCUITS IN A SEMICONDUCTOR DEVICE

(71) Applicant: Rambus Inc., Sunnyvale, CA (US)

(72) Inventor: Frederick A. Ware, Los Altos Hills, CA (US)

(73) Assignee: Rambus Inc., Sunnyvale, CA (US)

( * ) Notice: Subject to any disclaimer, the term of this patent is extended or adjusted under 35 U.S.C. 154(b) by 431 days.

(21) Appl. No.: 14/950,138

(22) Filed: Nov. 24, 2015

(65) Prior Publication Data
US 2016/0161552 A1 Jun. 9, 2016

Related U.S. Application Data

(63) Continuation of application No. 13/985,364, filed as application No. PCT/US2012/029071 on Mar. 14, 2012, now Pat. No. 9,213,054.
(Continued)

(51) Int. Cl.
*G01R 31/317* (2006.01)
*G01R 31/28* (2006.01)
(Continued)

(52) U.S. Cl.
CPC ..... *G01R 31/2882* (2013.01); *G01R 31/2607* (2013.01); *G01R 31/31726* (2013.01);
(Continued)

(58) Field of Classification Search
CPC ........ G01R 31/31922; G01R 31/31937; G01R 31/31726; G01R 31/3191; G01R 31/2607;
(Continued)

(56) References Cited

U.S. PATENT DOCUMENTS 4,486,835 A 12/1984 Bai et al.
5,742,798 A 4/1998 Goldrian
(Continued)

FOREIGN PATENT DOCUMENTS

JP 2002-040108 A 2/2002

OTHER PUBLICATIONS

International Search Report dated Oct. 10, 2012 and the Written Opinion re Int'l. Application No. PCT/US2012/029071. 10 Pages.
(Continued)

*Primary Examiner* — Tung X Nguyen
(74) *Attorney, Agent, or Firm* — Silicon Edge Law Group LLP; Arthur J. Behiel

(57) ABSTRACT

A semiconductor IC device comprises a timing circuit to transfer a timing signal, the timing circuit being configured to receive a first test signal and to effect a delay in the timing signal in response to the first test signal, the first test signal including a first timing event. The semiconductor IC device further comprises an interface circuit configured to transfer the data signal in response to the timing signal, the interface circuit being further configured to receive a second test signal and to effect a delay in the data signal in response to the second test signal, the second test signal including a second timing event that is related to the first timing event according to a test criterion.

8 Claims, 18 Drawing Sheets

Related U.S. Application Data

(60) Provisional application No. 61/452,466, filed on Mar. 14, 2011.

(51) Int. Cl.
*G11C 29/02* (2006.01)
*G11C 29/12* (2006.01)
*G11C 29/16* (2006.01)
*G11C 29/50* (2006.01)
*G01R 31/26* (2014.01)
*H03L 7/00* (2006.01)
*G11C 29/04* (2006.01)

(52) U.S. Cl.
CPC ...... *G11C 29/022* (2013.01); *G11C 29/12015* (2013.01); *G11C 29/16* (2013.01); *G11C 29/50012* (2013.01); *H03L 7/00* (2013.01); *G11C 2029/0401* (2013.01)

(58) Field of Classification Search
CPC ........ G01R 31/318328; G01R 31/2841; G01R 31/2882; G01R 31/31725; G01R 31/318357; G01R 31/31908
See application file for complete search history.

(56) References Cited

U.S. PATENT DOCUMENTS

| | | | |
|---|---|---|---|
| 5,929,650 A * | 7/1999 | Pappert | G01R 31/3008 324/750.3 |
| 7,020,862 B1 | 3/2006 | Alfke et al. | |
| 7,366,966 B2 | 4/2008 | LeBerge | |
| 7,466,160 B2 | 12/2008 | Ong et al. | |
| 2004/0153274 A1 | 8/2004 | Fukuda | |
| 2006/0267637 A1 | 11/2006 | Umemura et al. | |
| 2007/0113126 A1 | 5/2007 | Ong | |
| 2009/0295404 A1 * | 12/2009 | Matsumoto | G01R 31/3016 324/555 |
| 2009/0300314 A1 | 12/2009 | LaBerge et al. | |
| 2010/0013512 A1 | 1/2010 | Hargan et al. | |
| 2010/0014364 A1 | 1/2010 | Labarge et al. | |
| 2010/0052694 A1 | 3/2010 | Itoh | |
| 2010/0066443 A1 * | 3/2010 | Yamamoto | G01R 31/31727 329/347 |
| 2010/0095168 A1 | 4/2010 | Jeddeloh | |

OTHER PUBLICATIONS

Notification Concerning Transmittal of International Preliminary Report dated Sep. 26, 2012. re Int'l. Application No. PCT/US2012/029071, 7 pages.

* cited by examiner

ND APPARATUS FOR TESTING
METHODS AND APPARATUS FOR TESTING INACCESSIBLE INTERFACE CIRCUITS IN A SEMICONDUCTOR DEVICE

FIELD OF THE INVENTION

The field of the invention generally relates to semiconductor devices and more particularly to methods and systems for testing a semiconductor device.

BACKGROUND

Integrated circuit (IC) devices, such as memory controllers and memory devices, typically transmit and receive information synchronous with clock signals. For example, transitions of a clock signal indicate that valid information is available on a signal line or set of signal lines coupled to an IC device. Thus, IC devices operate under the constraints of a set of timing parameters so that information transfer may be synchronized according to the clock signals.

For example, an IC device typically has a specified input setup time ($t_S$) and input hold time ($t_H$). Input data should be present and stable on the device input pins from at least $t_U$ before a corresponding clock transition and until at least $t_H$ after the clock transition for proper operation. Also, the IC device typically has a specified minimum propagation time from clock to output ($t_{CKQ}$). Output data is valid on the output pins of the device at least $t_{CKQ}$ after the clock transition and should remain valid until a time $t_V$ after a next clock transition.

The input and output timing parameters of an IC device typically need to be tested to ensure proper operation of the device in a high speed system. To test an IC device, test equipment accesses the input and output pins of the IC device. Such access may be difficult when the IC device is directly attached to another IC device. For example, an IC memory device may be directly attached to an IC memory controller device such that neither the pins of the memory device nor the pins of the controller device are accessible to test equipment. It would be desirable, therefore, that IC devices in a directly attached configuration are designed to allow their input and output parameters be tested.

DETAILED DESCRIPTION

Figure 1A:
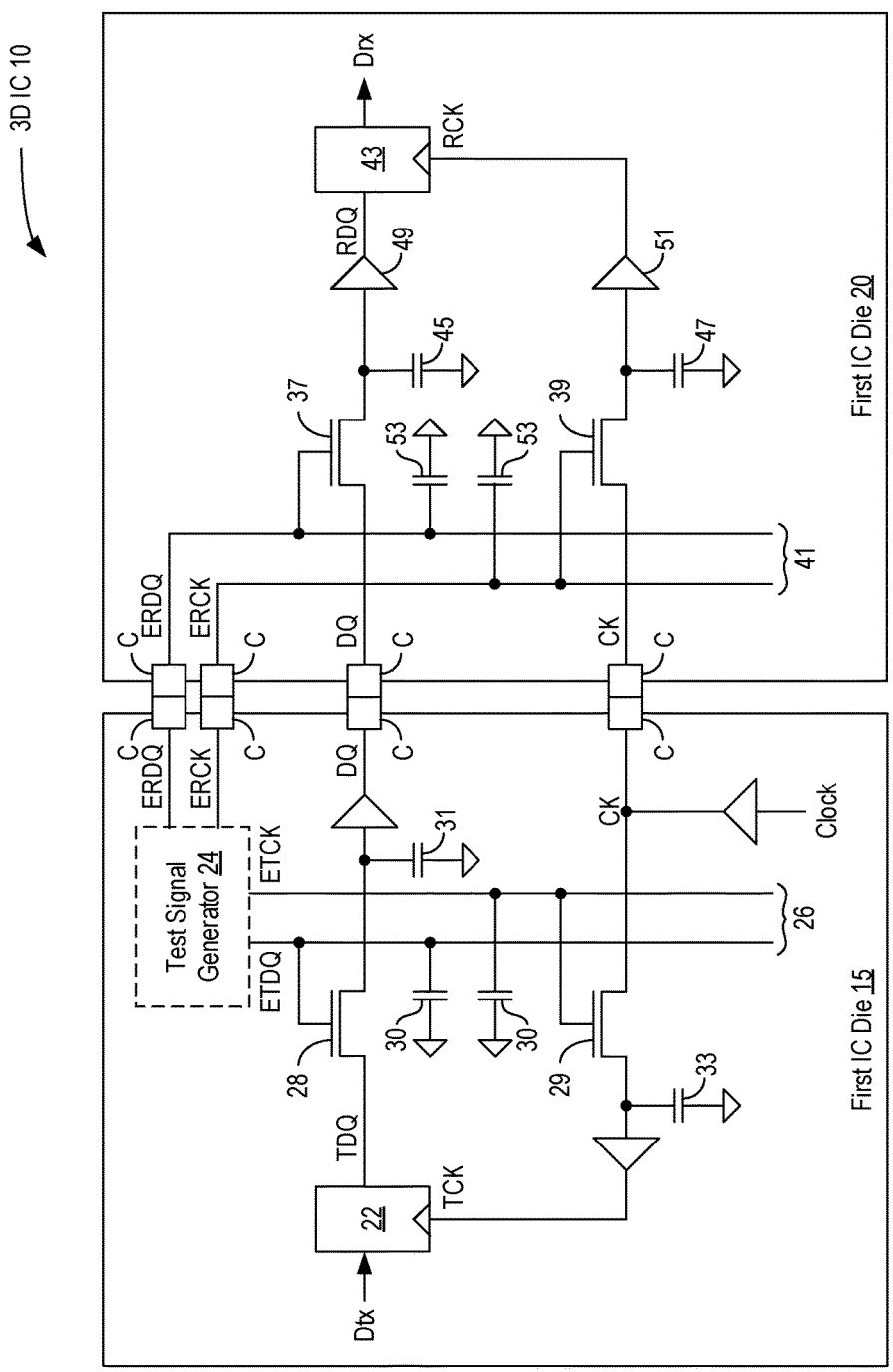
FIG. 1A depicts a three-dimensional integrated circuit (3D-IC) 10 in accordance with one embodiment.

FIG. 1A depicts a three-dimensional integrated circuit (3D-IC) 10 in accordance with one embodiment. 3D-IC 10 includes first and second IC dies 15 and 20 communicatively coupled using a proximity coupling technology. In this example, corresponding contact pads C are attached to one another via a direct-attach, face-to-face coupling technology to create data and clock interfaces DQ and CK for conveying like-identified data and clock signals. As a consequence of the direct bonding, pads C are difficult or impossible to access using external test equipment. 3D-CI 10 incorporates internal test resources that facilitate timing measurements for circuitry associated with these otherwise inaccessible signal interfaces.

Die 15 includes a synchronous element 22 that samples a data signal Dtx on edges of a clock signal TCK to convey data DQ to die 20. Transmit clock signal TCK is a delayed version of a clock signal CK that is shared with die 20. Clock signal CK is a buffered version of a locally generated clock signal Clock in this example, but the clock signal can be sourced elsewhere. Die 15 also includes a test signal generator 24, test-signal wires 26, and gating transistors 28 and 29 that collectively allow die 115 to alter the timing of clock signal TCK and data DQ in support of tests procedures detailed below.

Test signal generator 24 is integrated on die 15, but can be on e.g. die 20 or can be external to system 100. Test signal wires 26 are length and load matched, which may be accomplished via inclusion of suitable capacitors 30. Test signal wires 26 communicate test signals ETDQ and ETCK to selectively enable transistors 28 and 29, and thus sample respective data and clock signals TDQ and CK. The sampled signal levels are held on capacitances 31 and 33, which may be parasitic. Signal generator 24 can carefully time the delay between timing events (edges) on signals ETDQ and ETCK, and the matched wires 26 preserve this delay at transistors 28 and 29. Test signals ETDQ and ETCK can therefore precisely adjust the relative delays of signals DQ and TCK without impacting e.g. global clock signal Clock or the timing of data signal Dtx. These timing adjustments can be used to test various parameters of e.g. sequential element 22, as detailed below.

Die 20 receives data signal DQ and clock signal CK from die 15. Die 20 additionally receives a pair of test signals ERDQ and ERCK from test signal generator 24. Test signals ERDQ and ERCK are conveyed to respective gating transistors 37 and 39 via a pair of test-signal wires 41 so that test signals ERDQ and ERCK can selectively alter the timing of a receive data signal RDQ and a receive clock signal RCK to a sequential element 43. The sampled signal levels are held on capacitances 45 and 47, which may be parasitic, and the held levels are provided to element 43 via data and clock buffers 49 and 51. Test signal wires 41 are length and load matched, which may be accomplished via inclusion of suitable capacitors 53.

Test signal wires 41 communicate test signals ERDQ and ERCK to the respective gating transistors 37 and 39 to sample signals DQ and CK. Signal generator 24 can carefully time the delay between timing events (edges) on signals ERDQ and ERCK, and the matched wires 41 preserve this delay at transistors 37 and 39. Test signals ERDQ and ERCK can therefore precisely adjust the relative delays of the delayed data and clock signals RDQ and RCK. These timing adjustments can be used to test various parameters of e.g. sequential element 43.

Figure 1B:
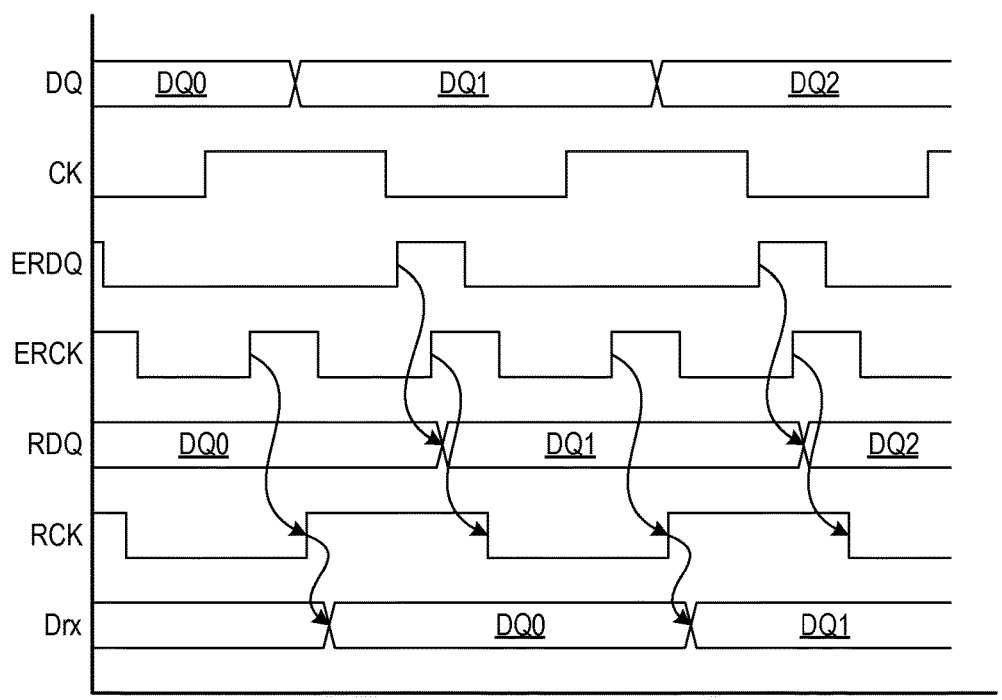
FIG. 1B is a waveform diagram illustrating the interaction of signals to IC die 20 that allow signal generator 24 of FIG. 1A to facilitate tests of receive timing parameters for receive element 43.

FIG. 1B is a waveform diagram illustrating the interaction of signals to IC die 20 that allow signal generator 24 of FIG. 1A to facilitate tests of receive timing parameters for sequential element 43. Such receive timing parameters include "set-up time" and "hold time," which describe the timing requirements on the data input RDQ of element 43 with respect to clock input RCK. The set-up and hold times define a window of time during which data must be stable to guarantee predictable performance over a full range of operating conditions and manufacturing tolerances. More particularly, the set-up time $t_S$ is the length of time that data must be available and stable before the arrival of a clock edge, and hold time $t_H$ is the length of time that data to be clocked into the logic element must remain stable after the arrival of clock edge. Test signals ERDQ and ERCK can be used to precisely varying the relative timing of signals RDQ and RCK at element 43. The set-up and hold times of element 43 can therefore be measured by varying this relative timing while monitoring signal Drx for errors.

With reference to FIG. 1B, the relative timing of data signal DQ and clock signal CK is established by die 15, and may not meet the requisite timing parameters for die 20. Test signal generator 24 asserts test signals ERDQ and ERCK to retime data and clock signals DQ and CK to respective signals RDQ and RCK, and therefore isolate die 20 from timing errors that may be induced at die 15. The phase offset between the retimed signals RDQ and RCK can be carefully controlled by signal generator 24 and matched wires 41 to facilitate set-up and hold time measurements. Isolating die 20 from timing errors introduced by die 15 allows the bonded dies to be tested separately.

Test signal generator 24 of FIG. 1A also facilitates tests of transmit timing parameters. Signal generator 24 and related wires 26 and transistors 28 and 29 can be used, for example, to measure the time required for the output of sequential element 22 to change states in response to clock signal TCK, the so-called "clock-to-Q" delay $t_Q$. This and other tests are detailed below. Briefly, test signal generator 24 asserts test signals ETDQ and ETCK to retime data and clock signals TDQ and CK to respective signals DQ and TCK. The phase offset between the retimed (delayed) signals DQ and TCK can be carefully controlled by signal generator 24 and matched wires 26 to facilitate clock-to-Q measurements.

Figure 1C:
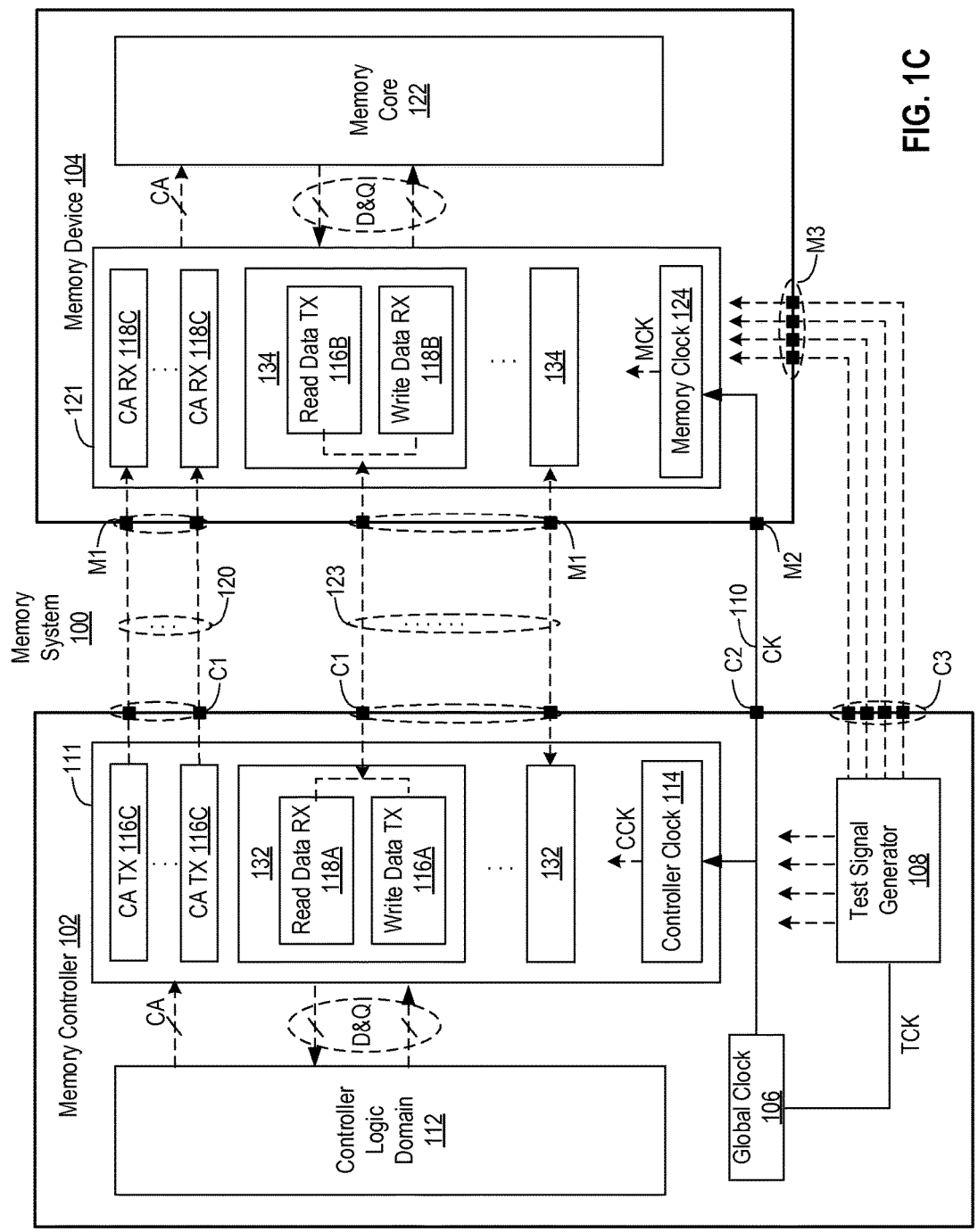
FIG. 1C is a block diagram representation of one embodiment of a memory system including a memory controller and a memory device.

Referring to FIG. 1C, a block diagram representation of one embodiment of a memory system 100 is shown. The memory system 100 generally includes a memory controller 102 and a memory device 104. In one embodiment, the memory controller 102 is a central processing unit (CPU). In one embodiment, the memory controller 102 is a graphics processing unit (GPU). In one embodiment, the memory device 104 is a dynamic random access memory (DRAM) device. While the memory system 100 is shown as including one memory controller 102, the memory system 100 may include more than one memory controller 102. While the memory system 100 is shown as including one memory device 104, the memory system 100 may include more than one memory device 104.

In one embodiment, the memory controller 102 is communicatively coupled to the memory device 104 using a proximity coupling technology. In one embodiment, the memory controller 102 includes terminals or contact pads C1, C2 that are communicatively coupled to terminals and contact pads M1, M2 of the memory device 104 using a direct-connect technology. In many cases, the memory controller 102 is disposed on a first silicon die and the memory device 104 is disposed on a second silicon die. Direct-connect technology allows for the direct coupling of the first silicon die to the second silicon die via their respective contact pads without the use of a package substrate in between. In one embodiment, the direct-connect technology used to communicatively couple the first silicon die to the second silicon die is a through-silicon-via (TSV) technology. In one embodiment, the direct-connect technology used to communicatively couple the first silicon die to the second silicon die is a direct-attach face-to-face coupling technology. While a number of different coupling technologies for communicatively coupling the memory controller 102 to the memory device 104 have been described, alternative coupling technologies may be used.

The memory system 100 further includes a global clock circuit 106. In one embodiment, the global clock circuit 106 is disposed within the memory system 100 but not at the memory controller 102. In one embodiment, the global clock circuit 106 is disposed at the memory controller 102 (as shown in FIG. 1C). The clock signal from the global clock circuit is transmitted from the memory controller 102 to the memory device 104 via a unidirectional clock data bus 110 that is coupled between pads C2 and M2 at the memory controller 102 and memory device 104, respectively.

The memory controller 102 generally includes a controller interface circuit 111 and a controller logic domain 112. The controller interface circuit 111 includes a controller clock interface 114, command/address (CA) data transmit (TX) interfaces 116C, and read/write data interfaces 132. Each CA data TX interface is coupled to a respective one of the contact pads C1, which in turn is coupled to one of a plurality of conductors in a unidirectional CA bus 120. Each read/write data interface 132 includes a write data transmit (TX) interface 116A and a read data receive (RX) interface 118A, which are both coupled to a respective one of the contact pads C1, which in turn is coupled to one of a plurality of conductors in a bidirectional data (DQ) bus 123.

The controller clock interface 114 receives the clock signal CK from the global clock circuit 106 and generates a controller clock signal CCK. The memory controller 102 generally performs controller operations at the memory controller 102 based on the controller clock signal CCK.

The CA data transmit interface 116C receives CA data from the controller logic domain 112 and transmits the received CA data to the memory device 104 via the unidirectional CA bus 120. Examples of CA data include, but are not limited to, read and/or write commands, read and/or write addresses, mask information and maintenance operation commands.

The read data receive interface 118A receives read data from the memory device 104 via the bidirectional read/write data bus 123 and transmits the received read data to the controller logic domain 112. The write data transmit interface 116B receives write data from the controller logic domain 112 and transmits the received write data to the memory device 104 via the bidirectional data bus 123.

The memory device 104 generally includes a memory interface 121 and a memory core 122. The memory interface 121 includes a memory clock interface 124, command/address (CA) data receive (RX) interfaces 118C, and read/write data interfaces 134. Each of the read/write interfaces 134 is coupled to a respective pad M1, which is coupled to a respective conductor of the data bus 123 and includes a read data transmit (TX) interface 116B and a write data receive (RX) interface 118B.

The memory core 122 includes memory cells for storing information. The memory clock interface 124 receives the clock signal CK from the global clock circuit 106 and generates a memory clock signal MCK. The memory device 104 generally performs memory operations based on memory clock signal MCK.

Each CA data receive interface 118C is coupled to a respective pad M1, which is coupled to a respective conductor of the CA bus 120. The CA data receive interfaces 118B receive CA data from the memory controller 102 via the unidirectional CA data bus 120 and initiate memory operations at the memory device 104 based on the received CA data. The read data transmit interface 116C receives read data from the memory core 122 and transmits the received read data to the memory controller 102 via the bidirectional read/write data bus 123. The write receive interface 118B receives write data from the memory controller 102 via the bidirectional read/write data bus 123 and sends the received write data to the memory core 122 for storage.

The test signal generator Te is communicatively coupled to the memory controller 102 and to the memory device 104. In one embodiment, the test signal generator 108 is disposed within the memory system 100 but not at the memory controller 102. In one embodiment, the test signal generator 108 is disposed at the memory controller 102 within the memory system 100 (as shown in FIG. 1C).

The data transmit interfaces and/or data receive interfaces in the system 100 operate in accordance with a set of pre-defined timing parameters. The data transmit interfaces at the semiconductor devices 102 or 104 operate in accordance with device specific data transmit timing parameters. Examples of the data transmit timing parameters include, but are not limited to, a data output time $t_Q$ and a data valid time $t_V$, which are discussed in more detail below. The data receive interfaces at the semiconductor devices 102 or 104 operate in accordance with device specific data receive timing parameters. Examples of the data receive timing parameters include, but are not limited to, a data set time $t_S$ and a data hold time $t_H$, which are discussed in more detail below.

The test signal generator 108 provides for the testing of individual semiconductor devices, such as the memory controller 102 and the memory device 104, to determine whether the semiconductor device is operating within the timing margins defined by the device specific timing parameters. When a semiconductor device is selected for testing, the test signal generator 108 generates test signals for individually testing the one or more data transmit interfaces and/or the one or more data receive interfaces at the semiconductor device to determine if they are operating in accordance with the device specific timing parameters.

More specifically, when the memory controller 102 is selected for testing, the test signal generator 108 can be used to individually or concurrently test the data transmit interfaces 116A, 116C to determine whether each of the data transmit interfaces 116A, 116C is operating in accordance with a few controller test parameters, such as a controller register data output time $t_{Q0}$, a controller data output time $t_Q$, and a controller data valid time $t_V$. The test signal generator 108 can also be used to test each data receive interface 118A to determine whether the data receive interface 118A is operating in accordance with a controller data set time $t_S$ and a controller data hold time $t_H$.

When the memory device 104 is selected for testing, the test signal generator can be used to test each data transmit interface 116C to determine whether the data transmit interface 116C is operating in accordance with a few memory test parameters, such as a memory register data output time $t_{M/Q0}$, a memory data output time $t_{M/Q}$, and a memory data valid time $t_{M/V}$. The test signal generator 108 can also be used to individually test the data receive interfaces 118B, 118C to determine whether each of the data receive interfaces 118B, 118C is operating in accordance with a memory data set time $t_{M/S}$ and a memory data hold time $t_{M/H}$. For ease of discussion, the memory register data output time $t_{M/Q0}$, the memory data output time $t_{M/Q}$, the memory data valid time $t_{M/V}$, the memory data set time $t_{M/S}$ and the memory data hold time $t_{M/H}$ are also referred to below as $t_{Q0}$, $t_Q$, $t_V$, $t_S$ and $t_H$, respectively, although they can be equal to or different in values from the corresponding parameters associated with the controller 102. In general, the same letter(s) or symbol(s) may be used herein to represent a parameter or value associated with the memory controller 102 as well as a corresponding parameter or value associated with the memory device 104 without implying that these parameters or values are the same parameter or equal to each other in value.

The global clock circuit 106 can be a conventional global clock circuit, which may include a clock signal generator and a clock signal buffer (not shown). The global clock circuit 106 outputs a clock signal TCK to the test signal generator 108 and a clock signal CK to the interface circuits in the system 100.

In one embodiment, the frequency of the clock signal generated in the global clock circuit 106 when a semiconductor device within the memory system 100 is selected for testing is approximately equal to the frequency of the clock signal generated in the global clock circuit 106 when the memory system 100 is in normal operation. In one embodiment, the frequency of the clock signal generated in the global clock circuit 106 during testing is relatively lower than the frequency of the clock signal generated in the global clock circuit 106 during normal operation.

Figure 1D:
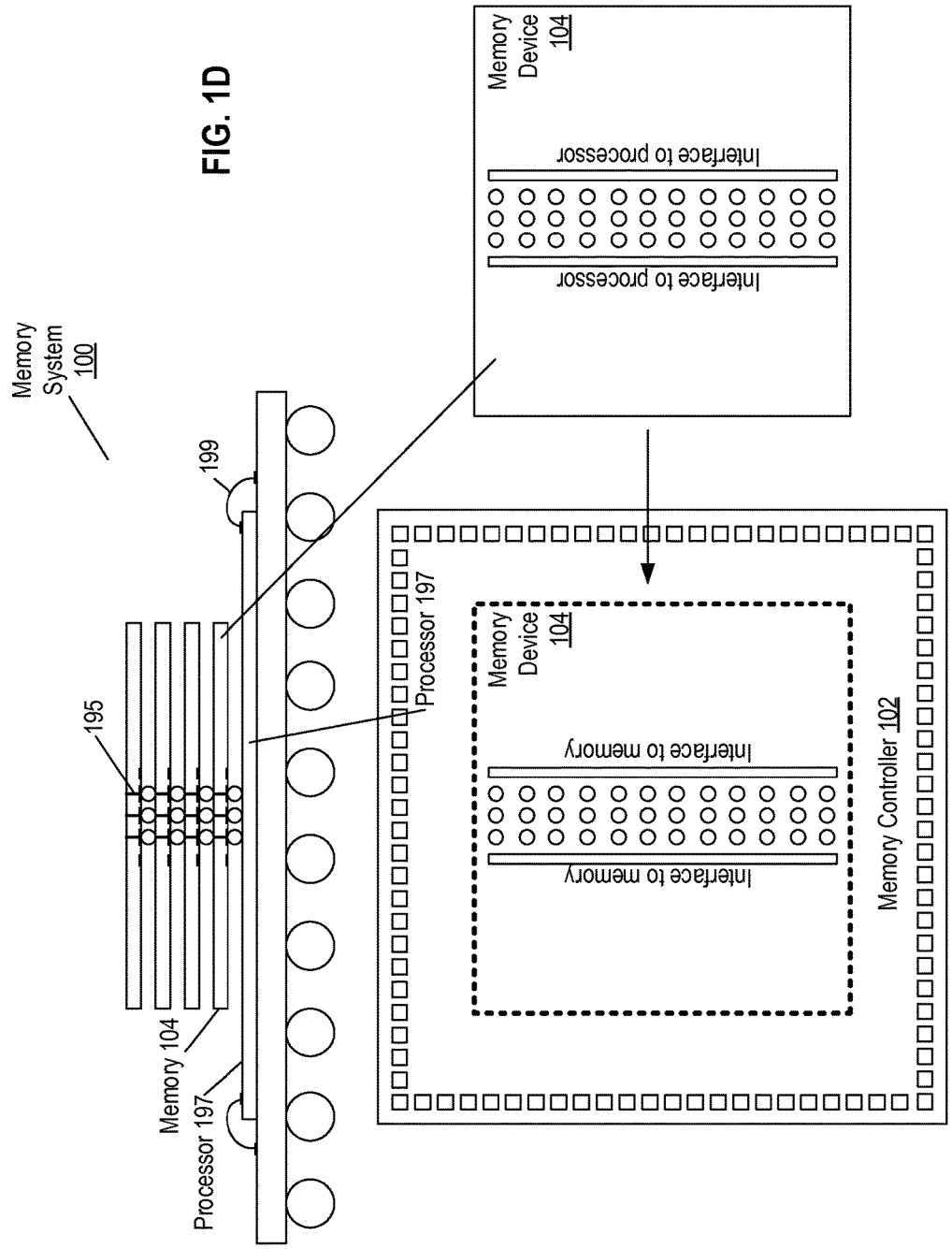
FIG. 1D is a block diagram representation of the memory system in a directly attached configuration according to one embodiment.

Referring to FIG. 1D, the memory device 104 can be one of a stack of one or more memory devices directly attached to the memory controller 102. The memory device 104 may include through-silicon vias (TSVs) 195 to facilitate the direct attachment. Another IC, such as a processor 197, can be included in the stack. ICs in the stack can be electrically connected using e.g. wire bonds 199 in lieu of TSVs.

Figure 2:
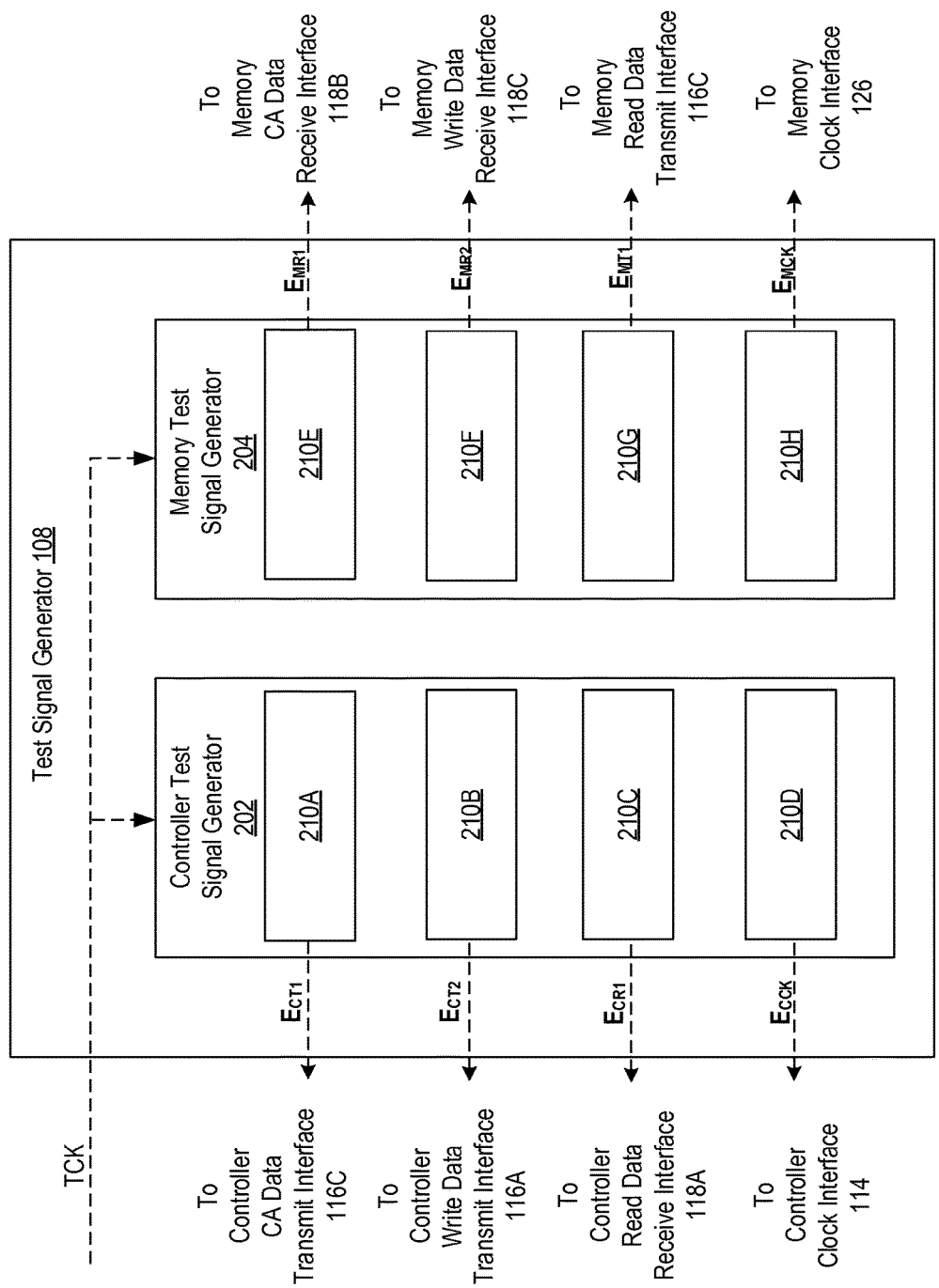
FIG. 2 is a block diagram representation of one embodiment of a test signal generator.

Referring to FIG. 2, a block diagram representation of one embodiment of a test signal generator 108 is shown. In one embodiment, the test signal generator 108 includes a controller test signal generator 202 and a memory test signal generator 204. In one embodiment, the memory system 100 includes a plurality of memory controllers 102 and the test signal generator 108 includes a plurality of controller test signal generators 202. Each of one or more of the plurality of controller test signal generators 202 is used to test a different one of the plurality of memory controllers 102 in the memory system 100. In one embodiment, the memory system 100 includes a plurality of memory devices 104 and the test signal generator 108 includes a plurality of memory test signal generators 204. Each of one or more of the plurality of memory test signal generators 304 is used to test a different one of the plurality of memory devices 104 in the memory system 100.

The controller test signal generator 202 includes test signal generating modules 210A-210D that receive the clock signal TCK and generate test signals $E_{CT1}$, $E_{CT2}$, $E_{CR1}$ and $E_{CCK}$, respectively. The memory test signal generator 204 includes test signal generating modules 210E-210H that receive the clock signal TCK and generate test signals $E_{MR1}$, $E_{MR2}$, $E_{MT1}$ and $E_{MCK}$, respectively. Each of the test signal generating modules 210A-210H is sometimes referred to as the test signal generating module 210.

Test signal $E_{CCK}$ is transmitted to the controller clock interface 114 by the controller test signal generator 202. Test signals $E_{CT1}$, $E_{CT2}$ are transmitted to the CA data transmit interface 116C and the write data transmit interface 116A, respectively, by the controller test signal generator 202. Test signal $E_{CR1}$ is transmitted to the read data receive interface 118A by the controller test signal generator 202.

Test signal $E_{MCK}$ is transmitted to the memory clock interface 124 by the memory test signal generator 204. Test signals $E_{MR1}$, $E_{MR2}$ are transmitted to the CA data receive interface 118C and the write data receive interface 118B, respectively, by the memory test signal generator 204. Test signal $E_{MT1}$ is transmitted to the read data transmit interface 116B by the memory test signal generator 204.

During non-test mode, e.g., normal operation, all of the test signals $E_{XXX}$ are held asserted (enabled) thereby allowing respective components controlled by the test signals to pass data or clock signals received by the components. When one or more interface circuits in the memory controller 102 or the memory device 104 are selected for testing with respect to one or more associated timing parameters, a subset of the test signals output from the test signal generator 108 would include timing events created based on the one or more associated timing parameters while the rest of the test signals are kept asserted or enabled.

Figure 3:
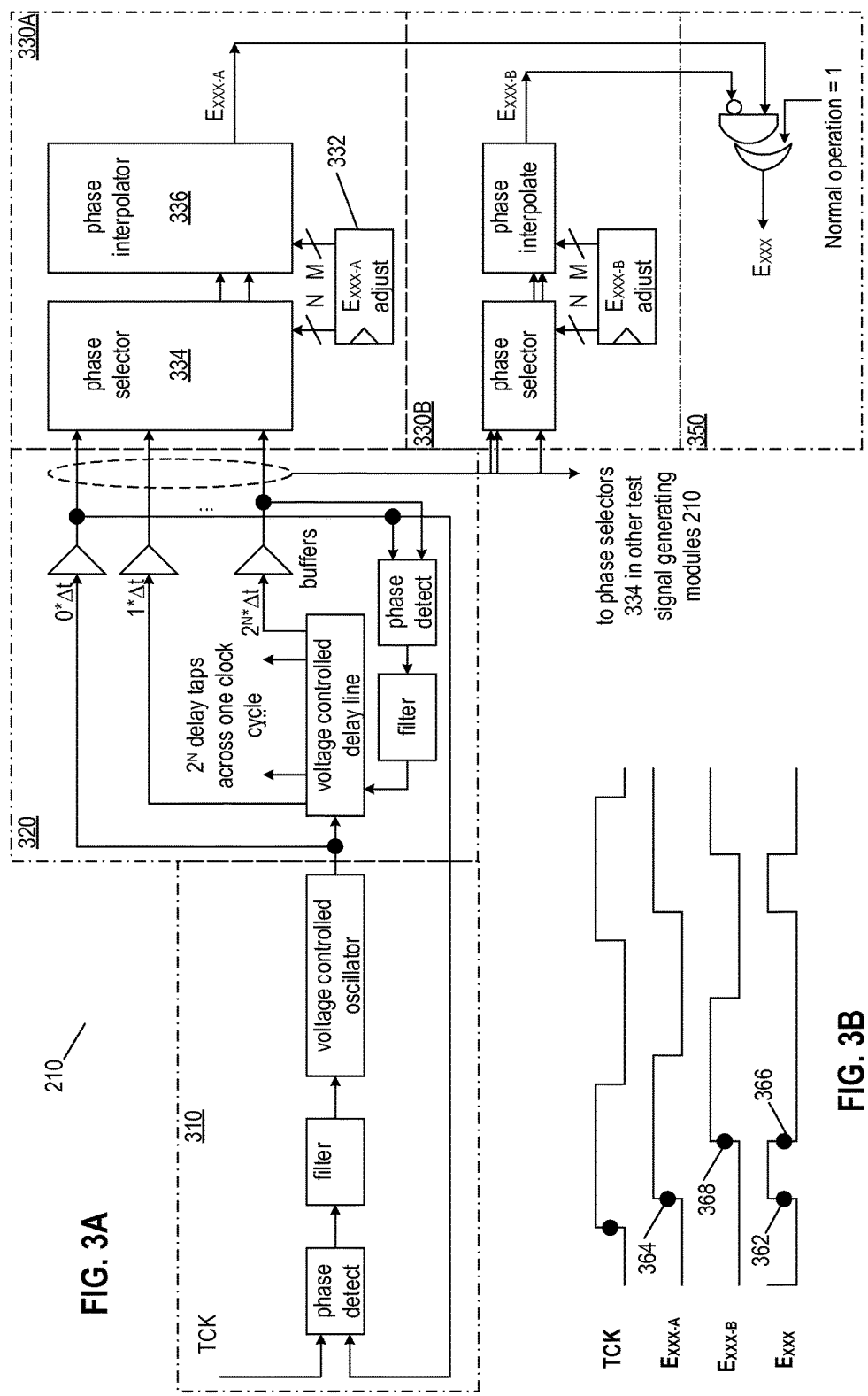
FIG. 3A is a block diagram representation of one embodiment of a test signal generating module in the test signal generator shown in FIG. 2.
FIG. 3B shows a wave diagram representation of clock signal TCK, first and second phase signals $E_{xxx-A}$ and $E_{xxx-B}$, and a test signal $E_{xxx}$.

Referring to FIG. 3A, a block diagram representation of a test signal generating module 210 is shown. The test signal generating module 210 includes a phase locked loop circuit (PLL) 310, a delay control circuit 320, first and second phase control circuits 330A and 330B, respectively, and combination logic circuit 350. In one embodiment, the PLL 310 and the delay control circuit 320 can be shared among the test signal generating modules 210A-210H.

FIG. 3B shows a wave diagram representation of clock signal TCK, first and second phase signals $E_{XXX-A}$ and $E_{XXX-B}$ output by the first phase control circuit 330A and 330B, respectively, and the test signal $E_{XXX}$ output by the test signal generating module 210, when the test signal is being used to test a selected interface circuit with respect to a selected timing parameter. The test signal $E_{XXX}$ can be any of the test signals $E_{CT1}$, $E_{CT2}$, $E_{CR1}$, $E_{CCK}$, $E_{MR1}$, $E_{MR2}$, $E_{MT1}$ and $E_{MCK}$.

Referring to FIGS. 3A and 3B, the PLL 310 receives the clock signal TCK and outputs a zero-phase clock signal that is phase-locked with the TCK but without any associated jitter that may have been present in the TCK. The delay control circuit 320 receives the zero-phase clock signal and outputs zero-phase clock signal together with $2^N$ phase shifted clock signals that are progressively delayed versions of the zero-phase clock signal. Each phase control circuit 330 includes a respective register circuit 332, a phase selector circuit 334 and a phase interpolator circuit 336. The phase selector circuit 334 selects one or more of the clock signals output by the delay control circuit 320 based on a setting N stored in the register circuit 332. The phase interpolator circuit 336 forms the phase signal $E_{XXX-A}$ or $E_{XXX-B}$ from the one or more clock signals selected by the phase selector circuit 332 based on a setting M stored in the register circuit 332. Either or both of the settings N and M can be dependent on the selected interface and the selected timing parameter, with respect to which the selected interface circuit is being tested. The combination logic circuit 350 receives the phase signal $E_{XXX-A}$ output by the first phase control circuit 330A and the second phase signal $E_{XXX-B}$ output by the phase control circuit 330B and output the test signal $E_{XXX}$ having a rising edge 362 phase-aligned with a rising edge 364 of the first phase signal $E_{XXX-A}$ and a falling edge 366 phase-aligned with a falling edge 368 of the second phase signal $E_{XXX-B}$.

Figure 4:
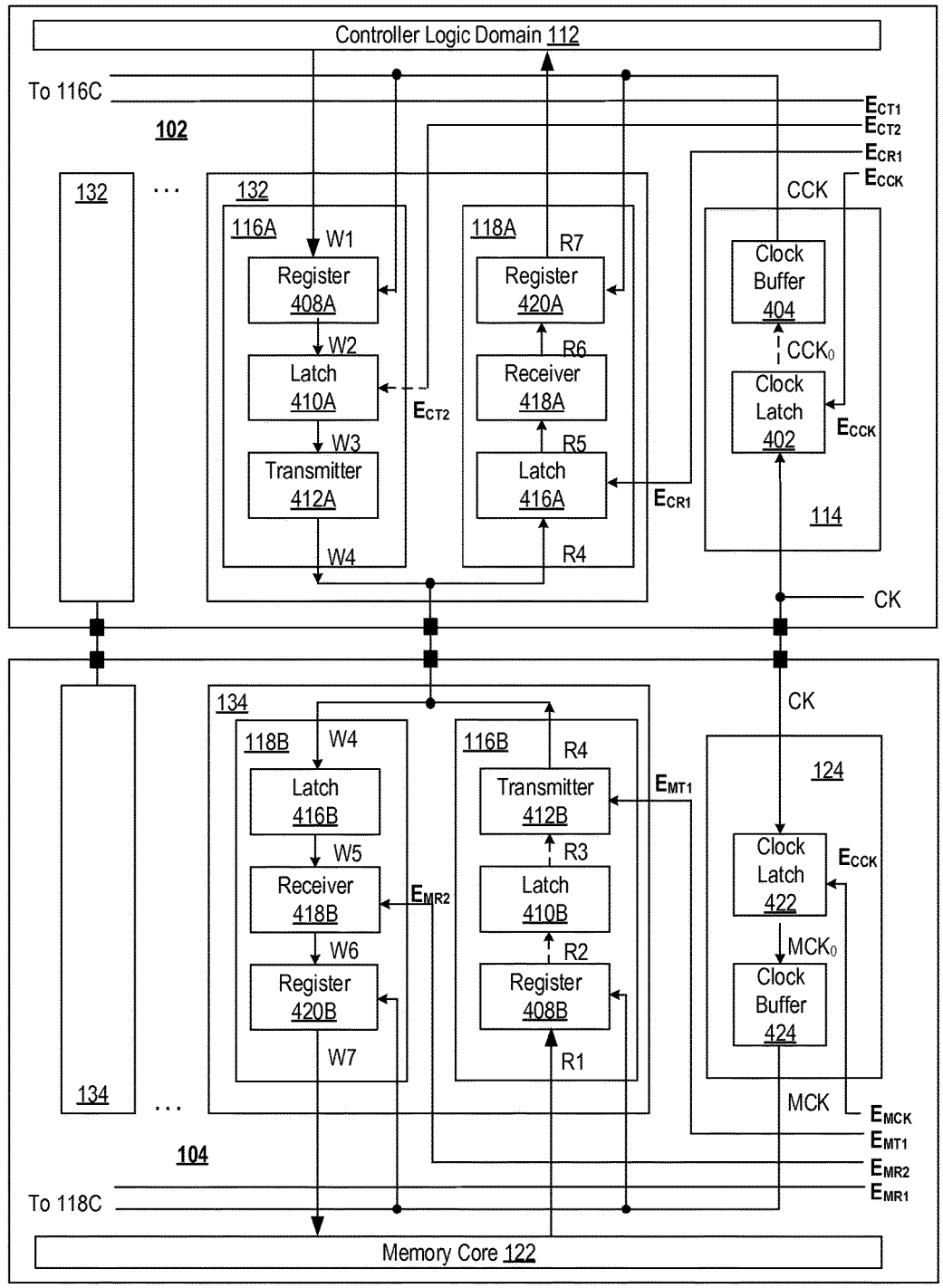
FIG. 4 is a block diagram representation of one embodiment of some interface components in the memory controller and memory device of the memory system shown in FIG. 1C.

Referring to FIG. 4, a block diagram representation of one embodiment of some of the interface circuits in the memory controller 102 and the memory device 104 is shown.

In the memory controller, the controller clock interface 114 includes a controller clock latch 402 and a controller clock buffer 404. Each write data transmit interface 116A includes a data transmit register 408A, a data transmit latch 410A and a data transmitter 412A. Each read data receive interface 118A includes a data receive latch 416A, a data receiver 418A and a data receive register 420A. The CA data transmit interfaces 116C (not shown in FIG. 4) are similar to the write data transmit interfaces 116A and can be tested similarly as the write data transmit interface 116A. Therefore, the discussion below regarding the operation and testing of the write data transmit interface 116A also applies to the operation and testing of the CA data transmit interfaces 116C.

In the memory device, the memory clock interface 124 includes a memory clock latch 422 and a memory clock buffer 424. Each read data transmit interface 116B includes a data transmit register 408B, a data transmit latch 410B and a data transmitter 412B. Each write data receive interface 118B includes a data receive latch 416B, a data receiver 418B and a data receive register 420B. The CA data receive interfaces 118C (not shown in FIG. 4) are similar to the write data receive interfaces 116A and can be tested similarly as the write data transmit interface 116A. Therefore, the discussion below regarding the operation and testing of the write data receive interface 118B also applies to the operation and testing of the CA data receive interfaces 118C.

Figure 5:
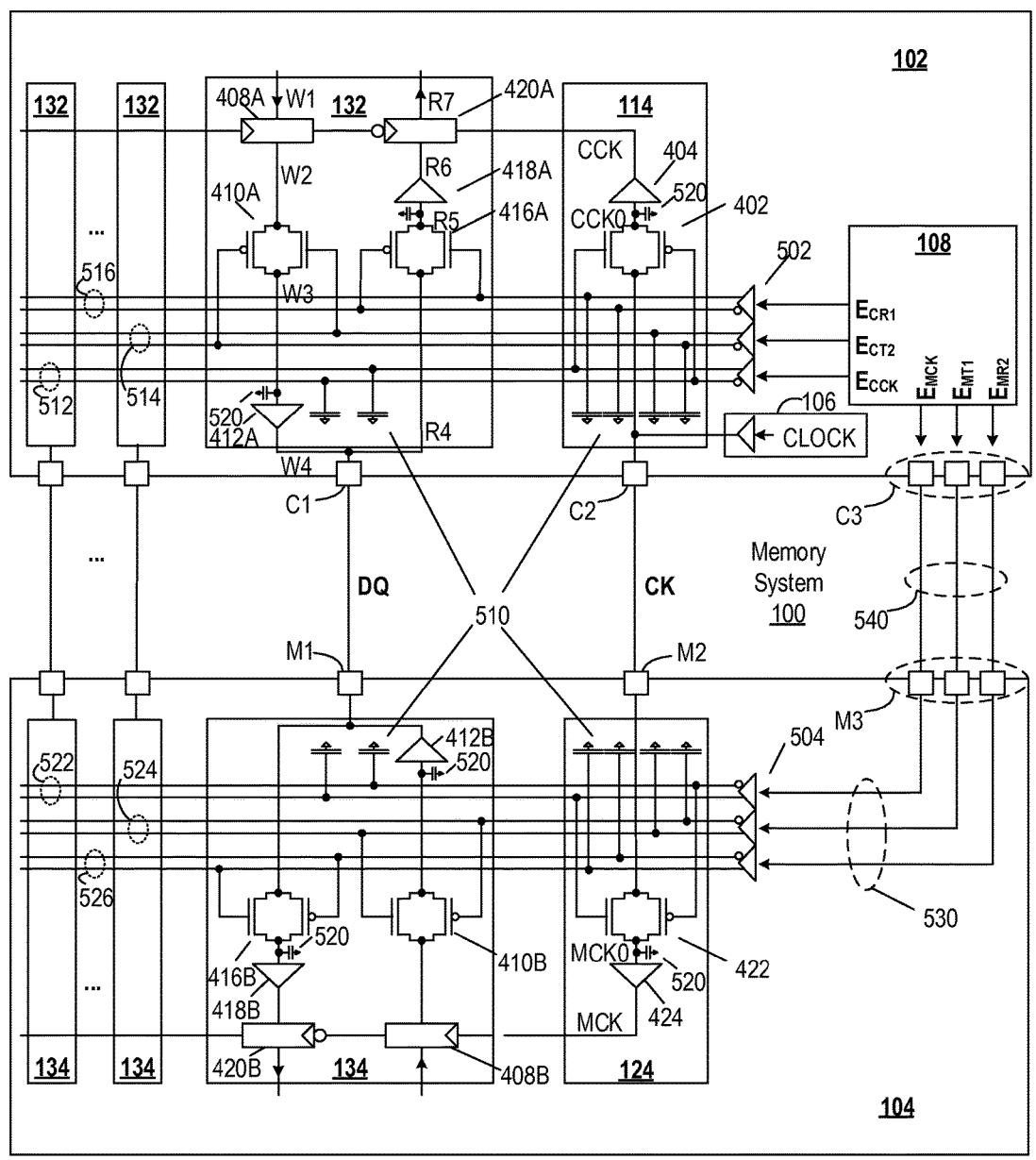
FIG. 5 is a circuit schematic diagram representation of one embodiment of some interface components in the memory controller and memory device of the memory system shown in FIG. 1C.

Referring to FIG. 5, one example of a circuit schematic representation of some of the interface circuits in the memory controller 102 and the memory device 104 of the memory system 100 is shown. As shown in FIG. 5, the clock latches 402 and 422, and the data transmit and data receive latches 410A, 416A, 410B, 416B include dynamic CMOS pass gates. FIG. 5 also shows that the memory controller 102 includes pairs of test-signal-wires 512, 514, and 516 for communicating the test signals.

FIG. 5 also shows that memory controller 102 includes test signal buffers 502 between the test signal wires 512, 514, and 516 and the test signal generator 108. Each test signal buffer 502 receives a test signal $E_{CCK}$, $E_{CR1}$, or $E_{CT2}$, and outputs a test signal pair to respective ones of a respective pair of test-signal-wires. The test signal wires 512, 514, and 516 in the memory controller 102 are length and load matched. The Memory controller 102 further includes load matching capacitors 510 to facilitate load matching the test signal wires 512, 514, and 516.

The memory device 104 includes pairs of test-signal-wire 522, 524, and 526. The pairs of test-signal-wire 522, 524, and 526 constitute first portions of the test-signal-wires for communicating the test signals $E_{MCK}$, $E_{MT1}$, or $E_{MR2}$ to the latches 422, 410B, and 416B in the memory device 104. The test-signal-wires for communicating the test signals $E_{MCK}$, $E_{MT1}$, or $E_{CR2}$ to the latches 422, 410B, and 416B in the memory device 104 also includes second portions 530 in the memory device 104 and third portions 540 external to the memory device 104 between test pins C3 of the memory controller 102 and test pins M3 of the memory device 104. The memory device 104 further includes test signal buffers 504 coupled between the first portions and second portions of the test-signal-wires for communicating the test signals $E_{MCK}$, $E_{MT1}$, or $E_{CR2}$ to the latches 422, 410B, and 416B in the memory device 104. In one embodiment, the entire test-signal-wires for communicating the test signals $E_{MCK}$, $E_{MT1}$, or $E_{CR2}$ to the latches 422, 410B, and 416B in the memory device 104 are length and load matched. The Memory device 104 further includes load matching capacitors 510 to facilitate load matching the test-signal-wires for communicating the test signals $E_{MCK}$, $E_{MT1}$, or $E_{CR2}$ to the latches 422, 410B, and 416B in the memory device 104.

The length and load matching of the test-signal-wires are important as it improves the accuracy of delays between data and timing signals created by the test signals, as discussed below. For example, each of the $E_{CCK}$ test-wires 516 is coupled to the latch 402 in the clock interface 114, but the $E_{CR1}$ and $E_{CT2}$ test-wires 514 and 516 are not coupled to any latches in the clock interface 114. So, each of the test-wires 514 and 516 is coupled to a capacitor whose loading is matched (at least approximately) to that of the latch 402. The same kind of matching is implemented in the 132, 124, and 134 interfaces.

As discussed above, the test-signal-wires for communicating the test signals $E_{MCK}$, $E_{MT1}$, or $E_{CR2}$ to the latches 422, 410B, and 416B in the memory device 104 include portions both internal and external to the memory device 104. The load and length matching is for these test-signal-wires is implemented based on the entirety of the test-signal-wires, including the portions internal and external to the memory device 104.

In one embodiment, each test signal buffer 502 or 504 has one input coupled to receive a respective test signal and two outputs, a positive output and a negative output. Each pair of test-signal-wires includes a negative test-signal-wire and a positive test-signal-wire coupled to respective ones of the outputs of a respective test signal buffer 502 or 504. In one embodiment, each latch (such as latch 402) includes a PMOS pass device with its gate connected to a negative test-signal-wire of a test-signal-wire pair (such as the 512 wire-pair), and a NMOS pass device with its gate connected to a positive test-signal-wire of a test-signal-wire pair (such as the 512 wire-pair).

When a test signal (such as the $E_{CCK}$) is enabled, the positive output of the respective test signal buffer is high, and the negative output is low. In this case, the signal on an input of a respective latch (such as latch 402) is passed through to its output. On the contrary, when the test signal is disabled, the positive output of the respective test signal buffer is low, and the negative output is high. In this case, the signal on an input of a respective latch (such as latch 402) is blocked, and the signal on its output is simply the last value it drove while enabled.

To help perform the above latching function, each latch 402, 422, 410A, 416A, 410B, or 416B further includes a capacitor 520. The capacitance of the capacitor 520 does not need to be large, since it only needs to hold the latch output for a short time (10's of nanoseconds, for example).

The dynamic CMOS pass gates are used to implement the latches 402, 422, 410A, 416A, 410B, and 416B because the incremental timing delay they add to the interfaces 114 and 124 and the interfaces 132 and 134 is small, but the latches 402, 422, 410A, 416A, 410B, and 416B can also be implemented using other components with similar latching functions.

Figure 6A:
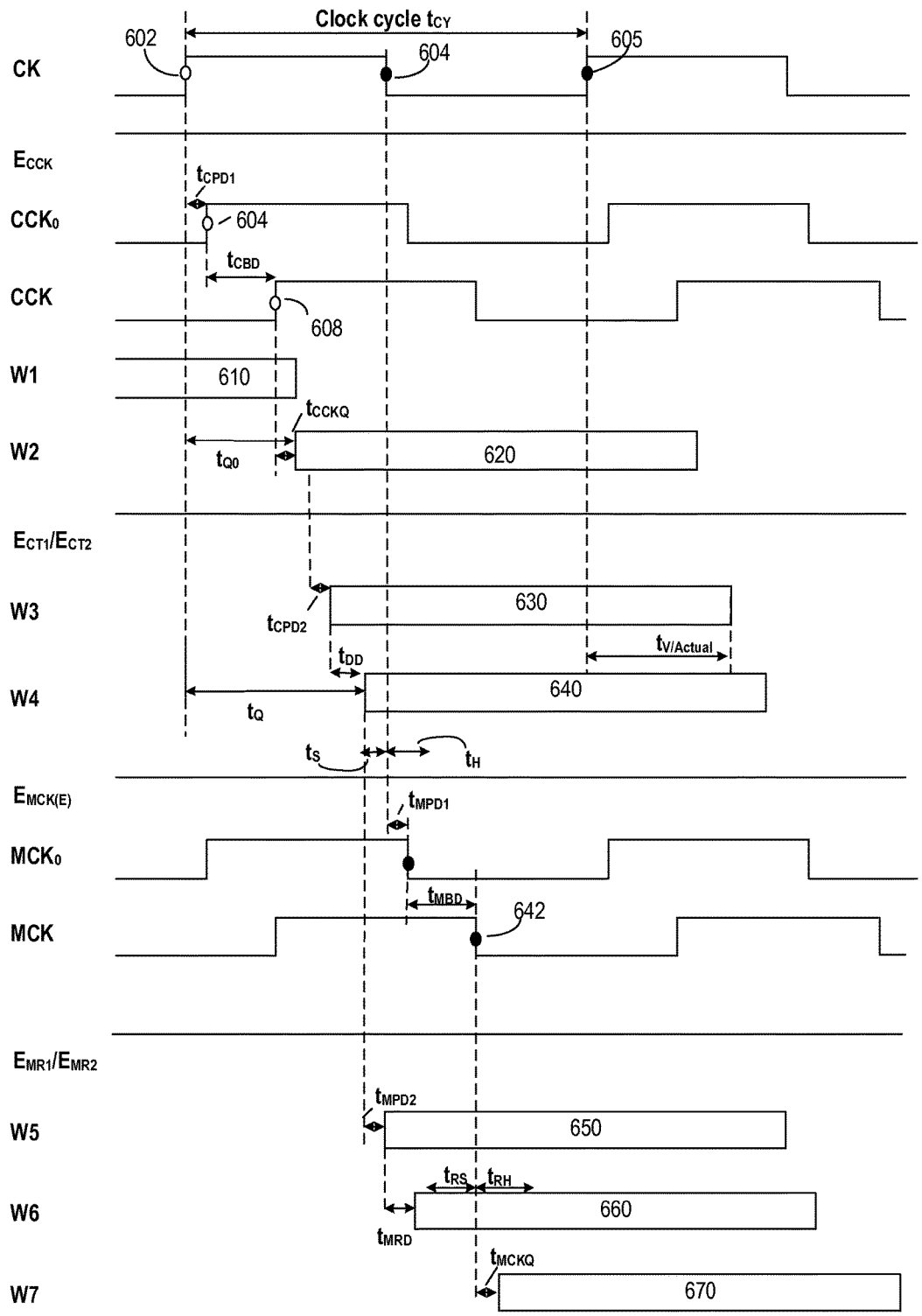
FIGS. 6A and 6B are exemplary timing diagrams illustrating non-test mode operation in the memory system shown in FIG. 3A.

Referring to FIG. 6A, where it is shown one example of a timing diagram illustrating a few timing parameters (e.g., $t_Q$, $t_S$, $t_H$, and $t_V$) associated with a timing path in the write data transmit interface 116A in the memory controller 102 and a timing path in the write data receive interface 118B in the memory device 104 in the memory system 100. As shown in FIGS. 5 and 6A, the controller clock latch 402 receives the clock signal CK from the global clock circuit 106 and the test signal $E_{CCK}$, which is asserted or enabled (e.g., held at a constant logic value) during normal operation thereby enabling the controller clock latch to transfer the clock signal CK. In one embodiment, the constant logic value is a logic high value. The clock signal CK, after passing the enabled controller clock latch 402 becomes the preliminary controller clock signal $CCK_0$. The controller clock latch 402 adds a controller pass-gate delay $t_{CPD1}$ to the clock signal CK as the clock signal CK passes through the controller clock latch 402, so the clock signal $CCK_0$ is delayed from the clock signal CK by a delay amount $t_{CPD1}$, as illustrated in FIG. 6A, which shows that a rising edge 602 of the clock signal CK is ahead of a corresponding rising edge 606 of the clock signal $CCK_0$ by an amount of time $t_{CPD1}$. The controller clock latch 402 transmits the preliminary controller clock signal $CCK_0$ to the controller clock buffer 404.

The controller clock buffer 404 receives the preliminary controller clock signal $CCK_0$ and transmits it as the controller clock signal CCK to the other interface circuits, including the write data transmit interface 116A. The controller clock buffer 404 adds a controller clock buffer delay $t_{CBD}$ to the preliminary controller clock signal $CCK_0$ as the preliminary controller clock signal $CCK_0$ is processed by the controller clock buffer 404, so the controller clock signal CCK is delayed from the preliminary controller clock signal $CCK_0$ by a delay amount $T_{CBD}$, as illustrated in FIG. 6A, which shows that the rising edge 606 of the clock signal $CCK_0$ is ahead of a corresponding rising edge 608 of the clock signal CCK by an amount of time $t_{CBD}$.

The write data transmit interface 116A receives write data W1 having a data valid time 610 from the controller logic domain and the controller clock signal CCK from the controller clock interface 114. The data transmit register 408A holds the received write data W1 and transmits the write data as write data W2 having a data valid time 620 in response to the controller clock signal CCK. In one embodiment, the data transmit register 408A transmits the write data W2 in response to the rising edge 608 of the controller clock signal CCK. Alternatively, the data transmit register 408A may transmit the write data W2 in response to a falling edge of the controller clock signal CCK (not shown). The data transmit register 408A adds a controller clock-to-output delay $t_{CCKQ}$ to the write data so the start of the data valid time 620 associated with the write data W2 is delayed from the rising edge 608 of the controller clock CCK by the delay amount $t_{CCKQ}$, as shown in FIG. 6A. The data transmit register 408A transmits the write data W2 to the data transmit latch 410A The data transmit latch 410A receives the write data W2 from the data transmit register 408A and the test signal $E_{CR1}$ from the test signal generator 108. The test signal $E_{CT2}$ is at a constant logic level during normal operation, thereby enabling the data transmit latch 410A to pass the write data. In one embodiment, the constant logic level is a logic high value. In one embodiment, the constant logic level is a logic low value (not shown). The enabled data transmit latch 410A allows the write data W2 to pass the data transmit latch 410A and be transmitted as write data W3 having a data valid time 630. The data transmit latch 410A adds a controller pass-gate delay $t_{CPD2}$ to the write data as the write data passes through the data transmit latch 410A, so write data W3 is delayed from write data W2 by a delay amount $t_{CPD2}$, as shown in FIG. 6A.

The data transmitter 412A receives the write data W3 from the data transmit latch 410A and transmits the write data as write data W4 having a data valid time 640 to the memory device 104. The data transmitter 412A adds a controller transmitter or driver delay $t_{DD}$ to the write data, so write data W4 is delayed from the write data W3 by a delay amount $t_{DD}$, as illustrated in FIG. 6A.

Referring to FIG. 5 and FIG. 6A, in the memory device 104, the memory clock latch 422B receives the clock signal CK from the global clock circuit 106 and the test signal $E_{MCK}$ from the test signal generator 108. The test signal $E_{MCK}$ is at a constant logic value during normal operation, enabling the memory clock latch to transfer the clock signal CK. In one embodiment, the test signal $E_{MCK(E)}$ during normal operation is at a logic high value. Alternatively, the test signal $E_{MCK(E)}$ is at a logic low value (not shown) to enable the memory clock latch to transfer the clock signal. The enabled memory clock latch 422 adds a memory pass-gate delay $t_{MPD1}$ to the global clock signal CK as the clock signal CK passes through the memory clock latch 422 and is transmitted as preliminary memory clock signal $MCK_0$. The memory clock latch 422 transmits the preliminary memory clock signal $MCK_0$ to the memory clock buffer 424.

The memory clock buffer 424 receives the preliminary memory clock signal $MCK_0$ and transmits the memory clock signal MCK. The memory clock buffer 424 adds a memory clock buffer delay $t_{MBD}$ to the preliminary memory clock signal $MCK_0$ as the preliminary memory clock signal $MCK_0$ is processed by the memory clock buffer 424 and transmitted as the memory clock signal MCK. The memory clock buffer 424 transmits the memory clock signal MCK to the other interface circuits, such as the data receive interface 118B.

In the data receive interface 118B, the data receive latch 416B receives the write data W4 from the memory controller 102 and the test signal $E_{MR1}$ from the test signal generator 108. The test signal $E_{MR1}$ is at a constant logic value (e.g., a logic high or logic low value) during normal operation, enabling the data receive latch 416B to transfer the data signal W4. The enabled data receive latch 416B adds a memory pass-gate delay $t_{MPD2}$ to the write data W4 as the write data W4 passes through the data receive latch 416B and is transmitted as the write data W5. So, the start of a data valid time 650 of the write data W5 is delayed from the start of the data valid time 640 of the write data W4. The data receive latch 416B transmits the write data W5 to the data receiver 418B.

The data receiver 418B adds a memory receiver delay $\delta_{MRD}$ to the write data W5 as the write data W5 passes through the data receiver 420B and is transmitted as the write data W6 to the data receive register 420B. So, the start of a data valid time 660 of the write data W6 is delayed from the start of the data valid time 650 of the write data W5.

The data receive register 420B receives write data W6 from the data receiver 418B and the memory clock signal MCK from the memory clock interface 124. The write data W6 is held by the data receive register 420B and is transmitted as write data W7 in response to the memory clock signal MCK. In one embodiment, the data receive register 420B transmits the write data W7 in response to a falling edge 642 of the memory clock signal MCK. The data receive register 420B adds a memory clock-to-output delay $t_{MCKQ}$ to the write data W7, resulting in the start of a data valid time 670 of the write data W7 being delayed from the falling edge 642 of the clock signal MCK by the delay amount $t_{MCKQ}$. The data receive register 420B transmits the write data W7 to the memory core 122.

Figure 6B:
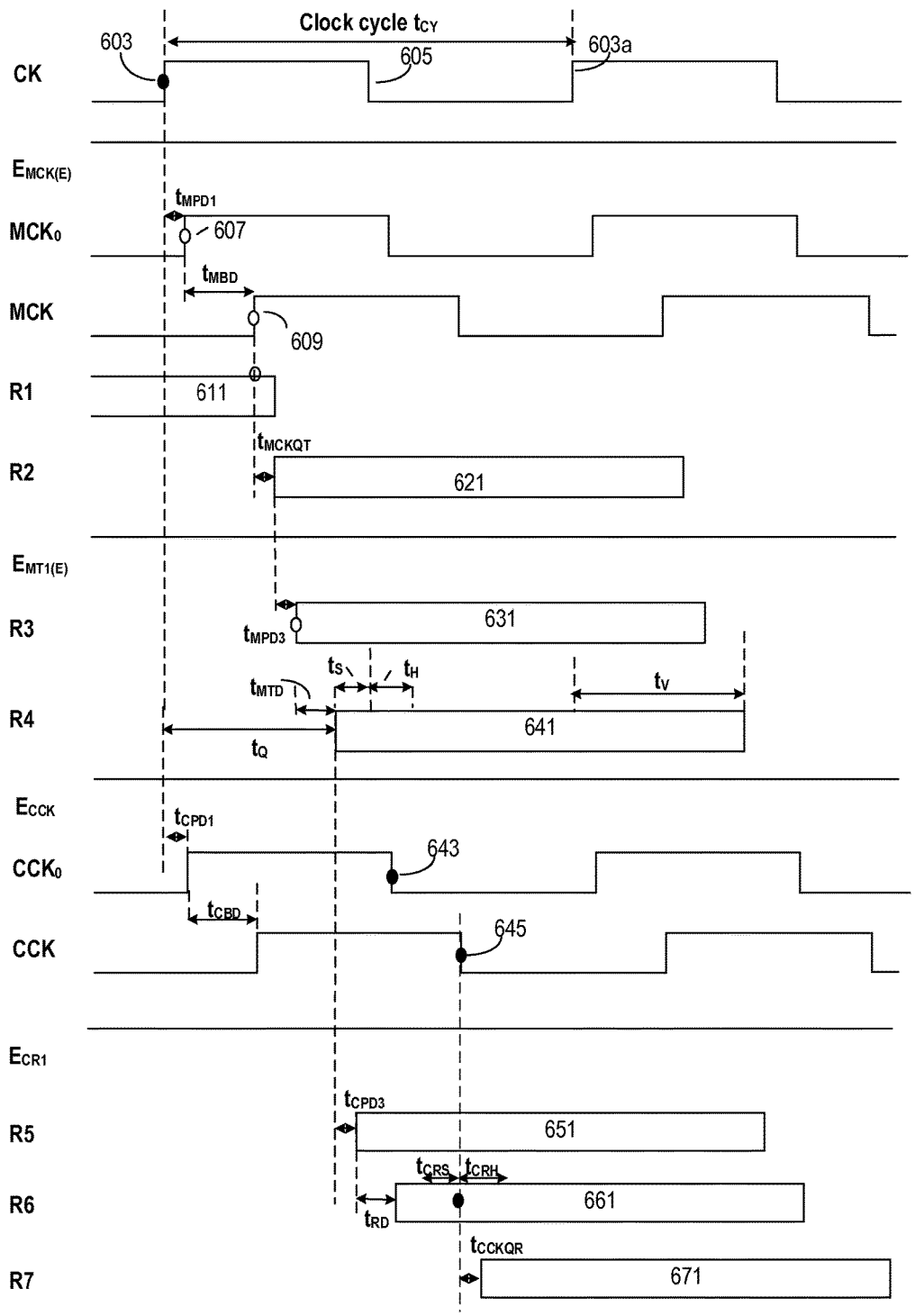

Referring to FIG. 6B, where it is shown one example of a timing diagram illustrating timing relationship of signals in a timing path in the read data transmit interface 116B in the memory device 104 and a timing path in the read data receive interface 118A in the memory controller 102, which are associated with a non-test mode data read operation in the memory system 100. As shown in FIGS. 5 and 6B, in the memory device 104, the memory clock latch 422B receives the clock signal CK from the global clock circuit 106 and the test signal $E_{MCK}$ from the test signal generator 108. The test signal $E_{MCK}$ is at a constant logic value (e.g., a logic high value or a logic low value) during normal operation, enabling the memory clock latch to transfer the clock signal CK. The enabled memory clock latch 422 adds a memory pass-gate delay $t_{MPD1}$ to the global clock signal CK as the clock signal CK passes through the memory clock latch 422 and is transmitted as preliminary memory clock signal $MCK_0$. The memory clock latch 422 transmits the preliminary memory clock signal $MCK_0$ to the memory clock buffer 424.

The memory clock buffer 424 receives the preliminary memory clock signal $MCK_0$ and transmits the memory clock signal MCK. The memory clock buffer 424 adds a memory clock buffer delay $t_{MBD}$ to the preliminary memory clock signal $MCK_0$ as the preliminary memory clock signal $MCK_0$ is processed by the memory clock buffer 424 and transmitted as the memory clock signal MCK. The memory clock buffer 424 transmits the memory clock signal MCK to the other interface circuits, such as the data transmit interface 116B.

In the data transmit interface 116B, the data transmit register 408B receives read data R1 from the memory core 122 and the memory clock signal MCK from the memory clock interface 124. The read data R1 is held by data transmit register 408B and is transmitted as read data R2 in response to the memory clock signal MCK. In one embodiment, the data transmit register 408 transmits the data R2 in response to a rising edge 609 of the memory clock signal MCK. Alternatively, the data transmit register 408B transmits the data R2 in response to a falling edge of the memory clock signal MCK (not shown). The data transmit register 408B adds a memory clock-to-output delay $t_{MCKQT}$ to the read data R2. So, the start of a data valid time 621 of the read data R2 is delayed from the rising edge 609 of the clock signal MCK by the delay amount $t_{MCKQT}$, as shown in FIG. 6B. The data transmit register 408B transmits the read data R2 to the data transmit latch 410B.

The data transmit latch 410B receives the read data R2 from the data transmit register 408B and the test signal $E_{MT1}$ from the test signal generator 108. The test signal $E_{MT1}$ is at a constant value (e.g., a logic high value or a logic low value) during normal operation of the memory system 100 thereby enabling the data transmit latch 410B to transfer the read data. The enabled data transmit latch 410B adds a memory pass-gate delay $t_{MPD3}$ to the read data as the read data passes through the data transmit latch 410B and is transmitted as read data R3. So, the data valid time 631 of the read data R3 is delayed from the data valid time 621 of read data R2 by the delay amount $t_{MPD3}$, as shown in FIG. 6B. The data transmit latch 410 transmits the read data R3 to the data transmitter 412.

The data transmitter 412B receives the read data R3 from the data transmit latch 410B and transmits the read data to the memory controller 102 as read data R4. The data transmitter 412B adds a memory transmitter delay $t_{MTD}$ to the read data as the data R3 passes through the data transmitter 412B. So, the data valid time 641 of the read data R4 is delayed from the data valid time 631 of read data R3 by the delay amount $t_{MTD}$, as shown in FIG. 6B.

Still referring to FIGS. 5 and 6B, in the memory controller 102, the controller clock latch 402 receives the clock signal CK and the test signal $E_{CCK}$, which is at a constant logic value (e.g., a logic high or low value) during normal operation, enabling the controller clock latch to transfer the clock signal CK. The clock signal CK, after passing the enabled controller clock latch 402 becomes the preliminary controller clock signal $CCK_0$. The controller clock latch 402 adds a controller pass-gate delay $t_{CPD1}$ to the clock signal CK as the clock signal CK passes through the controller clock latch 402, so the clock signal $CCK_0$ is delayed from the clock signal CK by a delay amount $t_{CPD1}$, as illustrated in FIG. 6B, which shows that a falling edge 605 of the clock signal CK is ahead of a corresponding falling edge 643 of the clock signal $CCK_0$ by an amount of time $t_{CPD1}$. The controller clock latch 402 transmits the preliminary controller clock signal $CCK_0$ to the controller clock buffer 404.

The controller clock buffer 404 receives the preliminary controller clock signal $CCK_0$ and transmits it as the controller clock signal CCK to the other interface circuits, including the read data receive interface 118A. The controller clock buffer 404 adds a controller clock buffer delay $t_{CBD}$ to the preliminary controller clock signal $CCK_0$ as the preliminary controller clock signal $CCK_0$ is processed by the controller clock buffer 404, so the controller clock signal CCK is delayed from the preliminary controller clock signal $CCK_0$ by a delay amount $t_{CBD}$, as illustrated in FIG. 6, which shows that the falling edge 643 of the clock signal $CCK_0$ is ahead of a corresponding falling edge 645 of the clock signal CCK by an amount of time $t_{CBD}$.

In the read data receive interface 118A, the data receive latch 416A receives the read data R4 from the memory device 104 and the test signal $E_{CR1}$ from the test signal generator 108. The test signal $E_{CR1}$ is a signal of constant value (e.g., a logic high or low value) during normal operation thereby enabling the data receive latch 416A to transfer the read data. The enabled data receive latch 416A adds a controller pass-gate delay $t_{CPD3}$ to the read data R4 as the read data passes through the data receive latch 416A and is transmitted as read data R5. So, the data valid time 651 of the read data R5 is delayed from the data valid time 641 of read data R4 by the delay amount $t_{CPD3}$, as shown in FIG. 6B. The data receive latch 416A transmits the data R5 to the data receiver 418A.

The data receiver 418A receives the read data R5 from the data receive latch 416A and transmits the read data R5 to the data receive register 420A. The data receiver 418A adds a controller receiver delay $t_{RD}$ to the data R5 as the data R5 passes through the data receiver 418A and is transmitted as read data R6 to the data receive register 420A. So, the data valid time 661 of the read data R6 is delayed from the data valid time 651 of read data R5 by the delay amount $t_{RD}$, as shown in FIG. 6B.

The data receive register 420A receives the read data R6 from the data receiver 418A and the controller clock signal CCK from the controller clock interface 114. The read data R6 is held by the data receive register 420A and is transmits by the data receive register 420A as read data R7 in response to the controller clock signal CCK. In one embodiment, the data receive register 420 transmits the data R7 in response to the falling edge 645 of the controller clock signal CCK. Alternatively, the data receive register 420 transmits the data R7 in response to a rising edge or the controller clock signal CCK (not shown). The data receive register 420A adds a controller clock-to-output delay $t_{CCKQR}$ to the data R7. So, the start of the data valid time 64 of the read data R7 is delayed from the falling edge 645 of the clock signal CCK by the delay amount $t_{CCKQR}$, as shown in FIG. 6B. The data receive register 420A transmits the read data R7 to the controller logic domain 112.

As stated above, the data transmit interfaces and/or data receive interfaces in the system 100 operate in accordance with a set of pre-defined timing parameters. For example, a pre-defined controller register output parameter $t_{Q0/max}$ defines a maximum for the time interval $t_{Q0}$ between the rising edge 602 of the clock signal CK and the start of the data valid time 620 associated with the write data W2, i.e.:

$$t_{CPD1} + t_{CBD} + t_{CCKQ} \leq t_{Q0/max} \quad \text{Equation (1a)}$$

Additionally, a pre-defined controller data output parameter $t_{Q/max}$ defines a maximum for the time interval $t_Q$ between the rising edge 602 of the clock signal CK and the start of the data valid time 640 associated with the write data W4, i.e.:

$$t_{CPD1} + t_{CBD} + t_{CCKQ} + t_{CPD2} + t_{DD} \leq t_{Q/max} \quad \text{Equation (1b)}$$

In other words, the data transmit circuit 406 will not operating within the timing margin defined by the controller data output time $t_{Q/max}$ if the sum of the component delays $t_{PD}$, $t_{BD}$, $t_{CKQ}$, $t_{PD}$, and $t_{DD}$ is longer than the value of the predefined controller data output time $t_{Q/max}$.

Additionally, a pre-defined controller data set time parameter $t_{S/min}$ defines a minimum for a period of time $t_S$ from the start of the data valid time 64 of the write data W4 and the falling edge 604 in the clock signal CK, as shown in FIG. 6A, to insure that the write data W4 will be properly received by the memory device 104. Thus, for proper operation of the data transmit interface 116A at the memory controller 102, the following needs to be satisfied:

$$t_{RS} + t_{MRD} + t_{MPD2} - t_{MBD} - t_{MPD1} \geq t_{S/min} \quad \text{Equation (2)}$$

Additionally, a pre-defined controller data hold time parameter $t_{H/min}$ defines a minimum for a period of time $t_H$ from the falling edge 604 in the clock signal CK to the end of the data valid time 640 of the write data W4, as shown in FIG. 6A, to insure that the write data W4 will be properly received by the memory device 104. Thus, for proper operation of the data transmit interface 116A at the memory controller 102, the following needs to be satisfied:

$$t_{RH} + t_{MBD} + t_{MPD2} - t_{RD} - t_{MPD1} \geq t_{H/min} \quad \text{Equation (3)}$$

Additionally, a pre-defined controller data valid parameter $t_{V/min}$ defines a minimum for a period of time $t_V$ that the write data W4 remains valid during the next clock cycle, as shown in FIG. 6A. Thus, for proper operation of the data transmit interface 116A at the memory controller 102, the following needs to be satisfied:

$$t_{CPD1}+t_{CBD}+t_{CCKQ}+t_{CPD2}+t_{DD} \geq t_{V/min} \quad \text{Equation (4)}$$

where $t_{S/Actual}$ is the time interval between the next falling edge 605 in the clock signal CK and the end of the data valid time 641 of the write data W4 and, as shown in FIG. 6A.

As shown in FIGS. 6A and 6B, the write data transmit interface 116A in the controller 102 and the read data transmit interface 116B in the memory device 104 operate similarly and are constrained by a similar set of parameters. As a result, the equations setting the criteria for the proper operation of the memory interfaces would be similar to those of the controller interfaces' and are thus omitted. The following discussion with regard to the testing of the write data transmit interface 116A can be readily modified to apply to the testing of the read data transmit interface 116B as well as the testing of the CA data transmit interface 116C in the controller 102, and vice versa. Also, the read data receive interface 118A in the controller 102, the CA data receive interface 118C and the write data receive interface 118B in the memory device 104 operate similarly and are constrained by a similar set of parameters. Therefore, the following discussion with regard to the testing of the read data receive interface 118A in the controller 102 can be applied to the testing of the write data receive interface 118B in the memory device 104 as well as the testing of the CA data receive interface in the memory device 104, and vice versa.

When one component of the memory system 100, such as for example the memory controller 102, has been selected for testing, the remaining components of the memory system 100 may operate in non-test mode or normal operating mode. In one embodiment, the timing related to the testing of a particular timing parameter for one component of the memory system 100 may be tightened while normal timing (or even relaxed timing) is used for the other component. This way, each timing path can be measured or tested separately. More relaxed timing can be forced by increasing the clock cycle time, except for the timing path(s) under test or measurement, which is put under the control of the respective test signals, one or more of which may be scanned until the timing path(s) fails in order to determine a margin by with the timing path(s) meets a certain test criterion, as discussed in more detail below.

The memory controller 102 includes two data transmit interfaces: the write data transmit interface 116A and the CA data transmit interface 116C. When the memory controller 102 is selected for testing, the write data transmit interface 116A and the CA data transmit interface 116C can be tested individually.

The data transmit interface 116C at the memory controller 102 and the read data transmit interface 116B at the memory device 104 can be tested in a similar manner as the write data transmit interface 116A, and vice versa. Therefore, the testing of the write data transmit interface 116A or the read transmit interface 116B is described herein as an example of the testing of data transmit interfaces 116 in the memory system 100. Similarly, the testing of the read data receive interface 118A or the write data receive interface 118B is described herein as an example of the testing of data transmit interfaces 118 in the memory system 100.

Furthermore, the data transmit interfaces 116 in all of the bit slice interfaces 132 may be tested concurrently. The following description will detail the testing of one of the write data transmit interfaces 116A with the understanding that all of the write data transmit interfaces 116A at the memory controller 102 may be tested individually or concurrently in a similar manner. Same is true for the data receive interfaces 118.

In the embodiments discussed herein, write data is transmitted on a rising edge of the controller clock CCK and is received on a falling edge of the memory clock MCK, while read data is transmitted on a rising MCK edge and received on a falling CCK edge. In other embodiments, write data is transmitted on a rising CCK edge and is received on a rising MCK edge, while read data is transmitted on a rising MCK edge and received on a rising CCK edge. In still other embodiments, write data is transmitted on both rising and falling CCK edges and is received on both rising and falling MCK edges, while read data is transmitted on both rising and falling MCK edges and is received on both rising and falling CCK edges.

Testing of Transmit Interface 116 for the Register Data Output Time $t_{Q0}$

Figure 7:
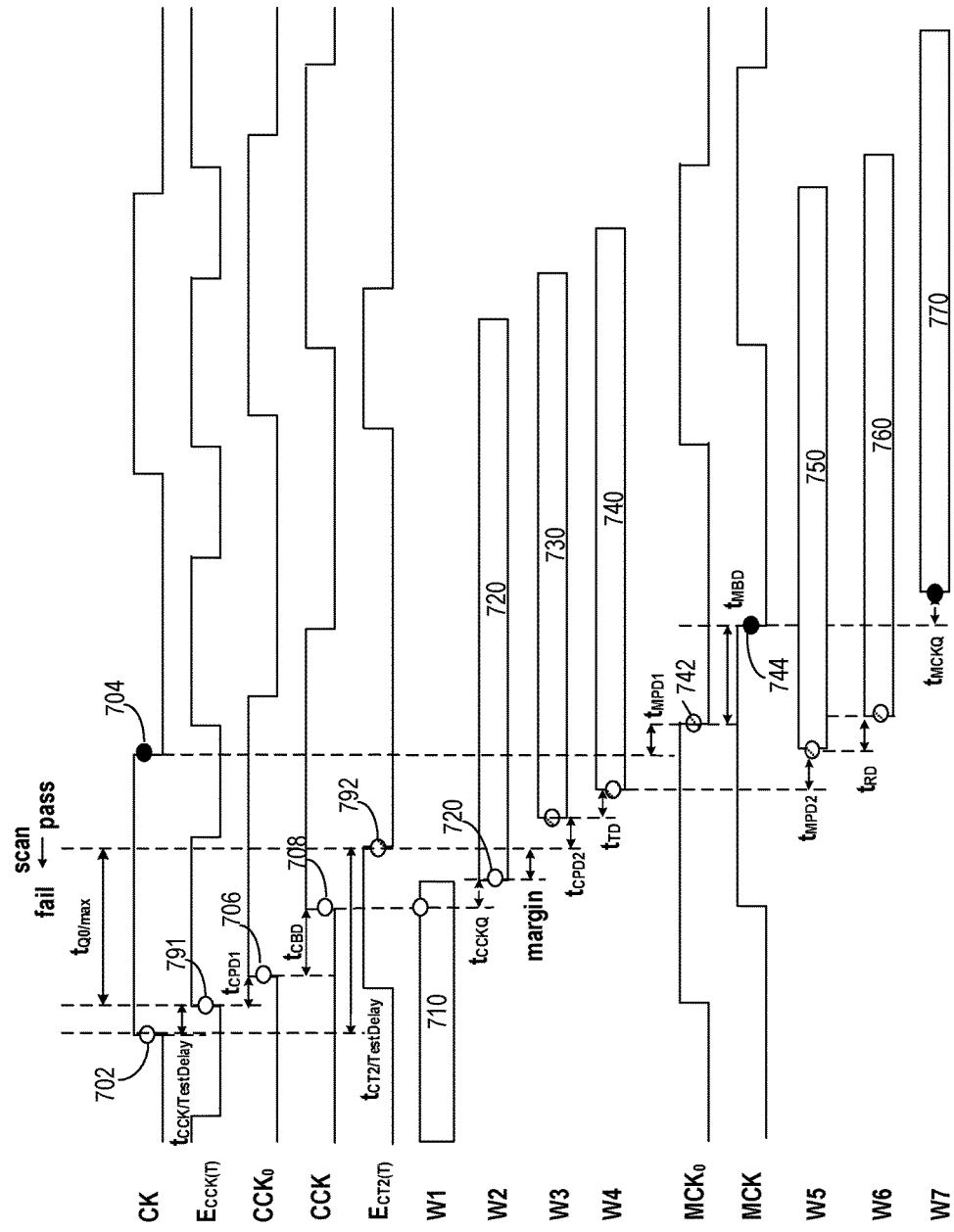
FIGS. 7-10B are exemplary timing diagrams illustrating the testing of interface circuits in the memory system of FIG. 1C.

Referring to FIG. 7, a timing diagram illustrating one example of the testing of one embodiment of the write data transmit interface 116A with respect to the controller register data output time $t_{Q0}$ is shown. As shown in FIGS. 5 and 7, the controller clock latch 402 receives the clock signal CK from the global clock circuit 106 and the test signal $E_{CCK}$. The clock signal CK includes a rising edge 702 and a falling edge 704. The test signal $E_{CCK}$ defines a plurality of timing events, including a first timing event 791, which can be a rising edge of the test signal $E_{CCK}$ and which is delayed from a corresponding rising edge 702 of the clock signal CK by a controller clock test delay $t_{CCK/TestDelay}$. The controller clock latch 402 transfers the clock CK in response to the timing events, causing the clock signal CK to be delayed by the controller clock test delay $t_{CCK/TestDelay}$. The controller clock latch 402 itself also adds an additional controller pass-gate delay to $t_{CPD1}$ to the clock signal CK, and outputs the clock signal as clock signal $CCK_0$, which has a rising edge 706 delayed from the corresponding rising edge 702 of the clock signal CK by an amount of time $t_{CCK/TestDelay}+t_{CPD1}$, as illustrated in FIG. 7. The controller clock latch 402 transmits the clock signal $CCK_0$ to the controller clock buffer 404.

The controller clock buffer 404 receives the clock signal $CCK_0$ and transmits it as clock signal CCK (controller clock signal) to the other interface circuits in the controller 102, including the write data transmit interface 116A. The controller clock buffer 404 adds a controller clock buffer delay $t_{CBD}$ to the preliminary clock signal $CCK_0$, so the controller clock signal CCK is delayed from the clock signal $CCK_0$ by a delay amount $t_{cBD}$, as illustrated in FIG. 7, which shows that the rising edge 702 of the clock signal $CCK_0$ is ahead of a corresponding rising edge 708 of the clock signal CCK by an amount of time $t_{CBD}$.

The write data transmit interface 116A receives write data W1 having a data valid time 710 from the controller logic domain and the controller clock signal CCK from the controller clock interface 114. The data transmit register 408A holds the received write data W1 and transmits the write data as write data W2 having a data valid time 720 in response to the controller clock signal CCK. In one embodiment, the data transmit register 408A transmits the write data W2 in response to a rising edge (e.g., the rising edge 708) of the controller clock signal CCK. The data transmit register 408A adds a controller clock-to-output delay $t_{CCKQ}$ to the write data so the start of the data valid time 720 associated with the write data W2 is delayed from the rising edge 708 of the controller clock CCK by the delay amount $t_{CCKQ}$, as shown in FIG. 7. The data transmit register 408A transmits the write data W2 to the data transmit latch 410A.

The data transmit latch 410A receives the write data W2 from the data transmit register 408A and the test signal $E_{CT2}$ from the test signal generator 108. The test signal $E_{CT2}$ defines a plurality of timing events, including a second timing event 792, which is delayed from the rising edge 702 of the clock signal CK by an amount of time $t_{CT2/TestDelay}$, as shown in FIG. 7. The data transmit latch 410A transfers the write data signal W2 in response to the timing events in the test signal $E_{CT2}$ and adds a pass gate delay $t_{CPD2}$ to the write data. So, write data W3 output by the data transmit latch 410A has a data valid time 730 starting $t_{CPD2}$ after the second timing event 792.

In one embodiment, to test whether Equation (1a) is valid, the time interval $\Delta t_1 = t_{CT2/TestDelay} - t_{CCK/TestDelay}$ between the first and second timing events 791 and 792 is set to be the data sheet parameter $t_{Q0/max}$. If $t_{Q0}$ is smaller than $t_{Q0/max}$ by possibly some margin (i.e., the controller interface 116A meets the criteria of Equation (1a)), information conveyed during the data valid time 720 in the write data W2 would be transferred by the data transmit latch 410A in response to the timing event 792, as shown in FIG. 7. On the contrary, if $t_{Q0}$ is larger than $t_{Q0/max}$, the timing event 792 would occur before the start of the data valid time 720 and information conveyed during the data valid time 720 in the write data W2 would not be transferred by the data transmit latch 410A in response to the timing event 792.

The data transmitter 412A receives the write data W3 from the data transmit latch 410A and transmits the write data as write data W4 having a data valid time 740 to the memory device 104. The data transmitter 412A adds a controller transmitter delay $t_{DD}$ to the write data, so write data W4 is delayed from the write data W3 by a delay amount $t_{DD}$, as illustrated in FIG. 7.

The test signals sent to the memory device 104 from the test signal generator are held asserted during this test. Therefore, the write data receive interface 118B should receive the write data W4 and process the write data similarly as discussed above with reference to FIG. 6A. Referring to FIG. 7, in the memory device 104, the memory clock latch 422B receives the clock signal CK from the global clock circuit 106 and adds a memory pass-gate delay $t_{MPD1}$ to the global clock signal CK as the clock signal CK passes through the memory clock latch 422 and is transmitted as preliminary memory clock signal $MCK_0$. The memory clock buffer 424 receives the preliminary memory clock signal $MCK_0$ and adds a memory clock buffer delay $t_{MBD}$ to the preliminary memory clock signal $MCK_0$ as the preliminary memory clock signal $MCK_0$ is processed by the memory clock buffer 424 and transmitted as the memory clock signal MCK.

In the data receive interface 118B, the data receive latch 416B receives the write data W4 from the memory controller 102 and adds a memory pass-gate delay $t_{MPD2}$ to the write data W4 as the write data W4 passes through the data receive latch 416B and is transmitted as the write data W5, with a data valid time 750. The data receiver 418B adds a memory receiver delay $t_{RD}$ to the write data W5 as the write data W5 passes through the data receiver 418B and is transmitted as the write data W6 (with a data valid time 760) to the data receive register 420B. The data receive register 420B receives write data W6 from the data receiver 418B and the memory clock signal MCK from the memory clock interface 124. The write data W6 is held by the data receive register 420B and is transmitted as write data W7 (with a data valid time 770) in response to falling edge 744 of the memory clock signal MCK. The data receive register 420B transmits the write data W7 to the memory core 122.

Thus, in one embodiment, whether the controller interface 116A meets the criteria of Equation (1a), is determined by whether the write data W7 output by register 420B to the memory core 122 in response to the falling edge 744 of the clock signal MCK includes the same information carried by the write data W1 during the data valid time 710.

In one embodiment, after determining that $t_{Q0}$ is equal to or smaller than $t_{Q0/max}$, the "margin" by which $t_{Q0}$ is smaller than $t_{Q0/max}$ can be determined by sweeping the second timing event 792, starting from a position where $\Delta t_1$ is equal to (or larger than) $t_{Q0}$ and moving toward the beginning 721 of the data valid time 720 of the write data W2. When the second timing event 792 moves past the data valid time 720 of the write data W2, the data transmit latch 410A stops transferring information carried by the write data W2 during the data valid time 720 in response to the second timing event and $\Delta t_1$ at this point should be equal to $t_{Q/0} = t_{PD} + t_{BD} + t_{CKQ}$, as shown in FIG. 7.

Testing of Transmit Interface 116 for the Data Output Time $t_Q$

Figure 8:
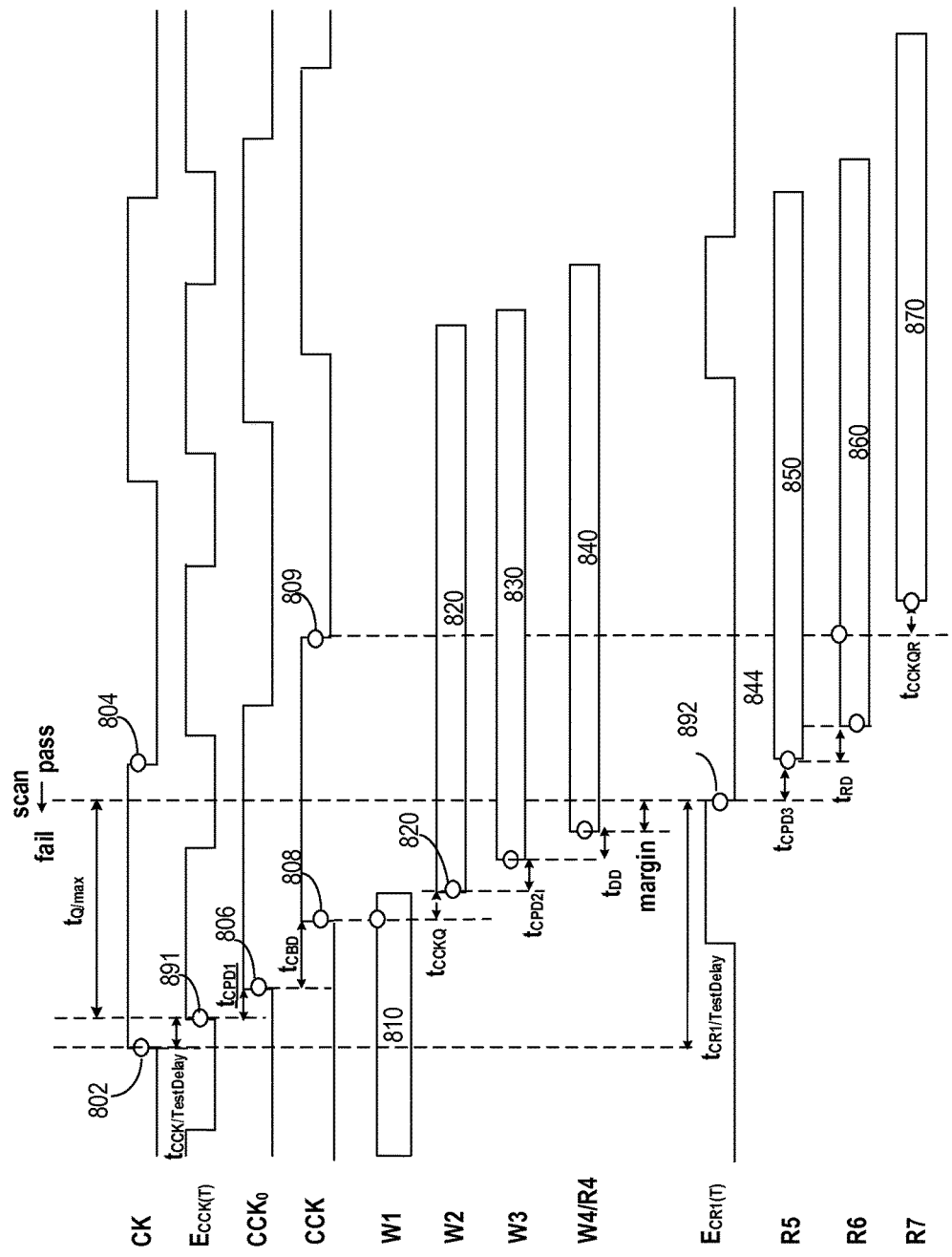

Referring to FIG. 8, a timing diagram illustrating one example of the testing of one embodiment of the write data transmit interface 116A with respect to the controller register data output time $t_Q$ is shown. As shown in FIGS. 5 and 8, the controller clock latch 402 receives the clock signal CK from the global clock circuit 106 and the test signal $E_{CCK}$. The clock signal CK rising edge 802 and a falling edge 804. The test signal $E_{CCK}$ defines a plurality of timing events, including a first timing event 891, which can be a rising (or falling) edge of the test signal $E_{CCK}$. The controller clock latch 402 transfers the clock CK in response to the timing event 891, thereby delaying the clock signal CK by a controller clock test delay $t_{CCK/TestDelay}$. The controller clock latch 402 itself also adds an additional controller pass-gate delay to $t_{CPD1}$ to the clock signal CK. The clock signal CK, after passing the controller clock latch 402 becomes clock signal $CCK_0$, which has a rising edge 806 delayed from the corresponding rising edge 802 the clock signal CK by an amount of time $t_{CCK/TestDelay} + t_{CPD1}$, as illustrated in FIG. 8. The controller clock latch 402 transmits the clock signal $CCK_0$ to the controller clock buffer 404.

The controller clock buffer 404 receives the clock signal $CCK_0$ and transmits it as clock signal CCK (controller clock signal) to the other interface circuits, including the write data transmit interface 116A. The controller clock buffer 404 adds a controller clock buffer delay $t_{CBD}$ to the preliminary clock signal $CCK_0$ as the clock signal $CCK_0$ is processed by the controller clock buffer 404, so the controller clock signal CCK is delayed from the clock signal $CCK_0$ by a delay amount $t_{CBD}$, as illustrated in FIG. 8, which shows that the rising edge 802 of the clock signal $CCK_0$ is ahead of a corresponding rising edge 808 of the clock signal CCK by an amount of time $t_{CBD}$.

The write data transmit interface 116A receives write data W1 from the controller logic domain and the controller clock signal CCK from the controller clock interface 114. The data transmit register 408A holds the received write data W1, which has a data valid time 810, and transmits the write data as write data W2 having a data valid time 820 in response to the controller clock signal CCK. In one embodiment, the data transmit register 408A transmits the write data W2 in response to a rising edge (e.g., the rising edge 808) or a falling edge (not shown) of the controller clock signal CCK. The data transmit register 408A adds a controller clock-to-output delay $t_{CCKQ}$ to the write data so the start of the data valid time 820 associated with the write data W2 is delayed from the rising edge 808 of the controller clock CCK by the delay amount $t_{CCKQ}$, as shown in FIG. 8. The data transmit register 408A transmits the write data W2 to the data transmit latch 410A.

The data transmit latch 410A receives the write data W2 from the data transmit register 408A and the test signal $E_{CT2}$ (not shown in FIG. 8) from the test signal generator 108. The test signal $E_{CT2}$ is asserted, allowing the data transmit latch 410A to pass the write data. The data transmit latch 410A adds a controller pass-gate delay $t_{CPD2}$ to the write data as the write data passes through the data transmit latch 410A. The write data W2 after passing the data transmit latch 410A becomes write data W3 having a data valid time 830, which is delayed from the data valid time 820 of write data W2 by a delay amount equal to $t_{CPD2}$, as shown in FIG. 8.

The data transmitter 412A receives the write data W3 from the data transmit latch 410A and transmits the write data as write data W4 having a data valid time 840 to a corresponding terminal C1. The data transmitter 412A adds a controller transmitter delay $t_{DD}$ to the write data, so write data W4 is delayed from the write data W3 by a delay amount $t_{DD}$, as illustrated in FIG. 8.

The write data W4 is received by the data receive latch 416A in the same interface 132 at the memory controller 102 as read data R4. The data receive latch 416A also receives the test signal $E_{CR1}$, which defines a plurality of timing events, including a second timing event 892 that is delayed from the rising edge 802 of the clock signal CK by an amount of time $t_{CR1/TestDelay}$, as shown in FIG. 8.

In one embodiment, to test whether Equation (1b) is valid, the time interval $\Delta t_2 = t_{CT2/TestDelay} - t_{CCK/TestDelay}$ between the first and second timing events 891 and 892 is set to be the data sheet parameter $t_{Q/max}$. If $t_Q$ is smaller than $t_{Q/max}$ by possibly some margin (i.e., the controller interface 116A meets the criteria of Equation (1b)), information conveyed during the data valid time 840 in the write data W4 would be transferred by the data transmit latch 416A in response to the timing event 892, as shown in FIG. 8. On the contrary, if $t_Q$ is larger than $t_{Q/max}$, the timing event 892 would occur before the start of the data valid time 840 and information conveyed during the data valid time 840 in the write data W4 would not be transferred by the data transmit latch 416A in response to the timing event 892.

After the read data R4 is transferred by the data receive latch 416A, it becomes read data R5, as shown in FIG. 8. The read data R5 becomes read data R6 after passing the receiver 418A and is output by the register 420A to the controller logic domain 112 as read data R7 in response to the falling edge 809 of the controller clock CCK, as shown in FIG. 8. Thus, in one embodiment, whether the controller interface 116A meets the criteria of Equation (1b), is determined by whether the read data R7 output by the register 420A in response to the falling edge 809 of the controller clock CCK includes the same information carried by the write data W1 during the data valid time 810, as shown in FIG. 8.

In one embodiment, after determining that $t_Q$ is equal to or smaller than $t_{Q/max}$, the "margin" by which $t_Q$ is smaller than $t_{Q/max}$ can be determined by sweeping the second timing event 892, starting from a position where $\Delta t_2$ is equal to (or larger than) $t_Q$ and moving toward the beginning 841 of the data valid time 840 of the read data R4. When the second timing event 892 moves past the data valid time 840 of the read data R4, the data receive latch 416A stops transferring the information the write data W2 carries during the data valid time 720 in response to the second timing event and $\Delta t_2$ at this point is equal to $t_{Q/Actual} = 2*t_{PD} + t_{BD} + t_{CKQ} + t_{DD}$.

Testing of Transmit Interface 116 for the Data Valid Time $t_V$

Figure 9:
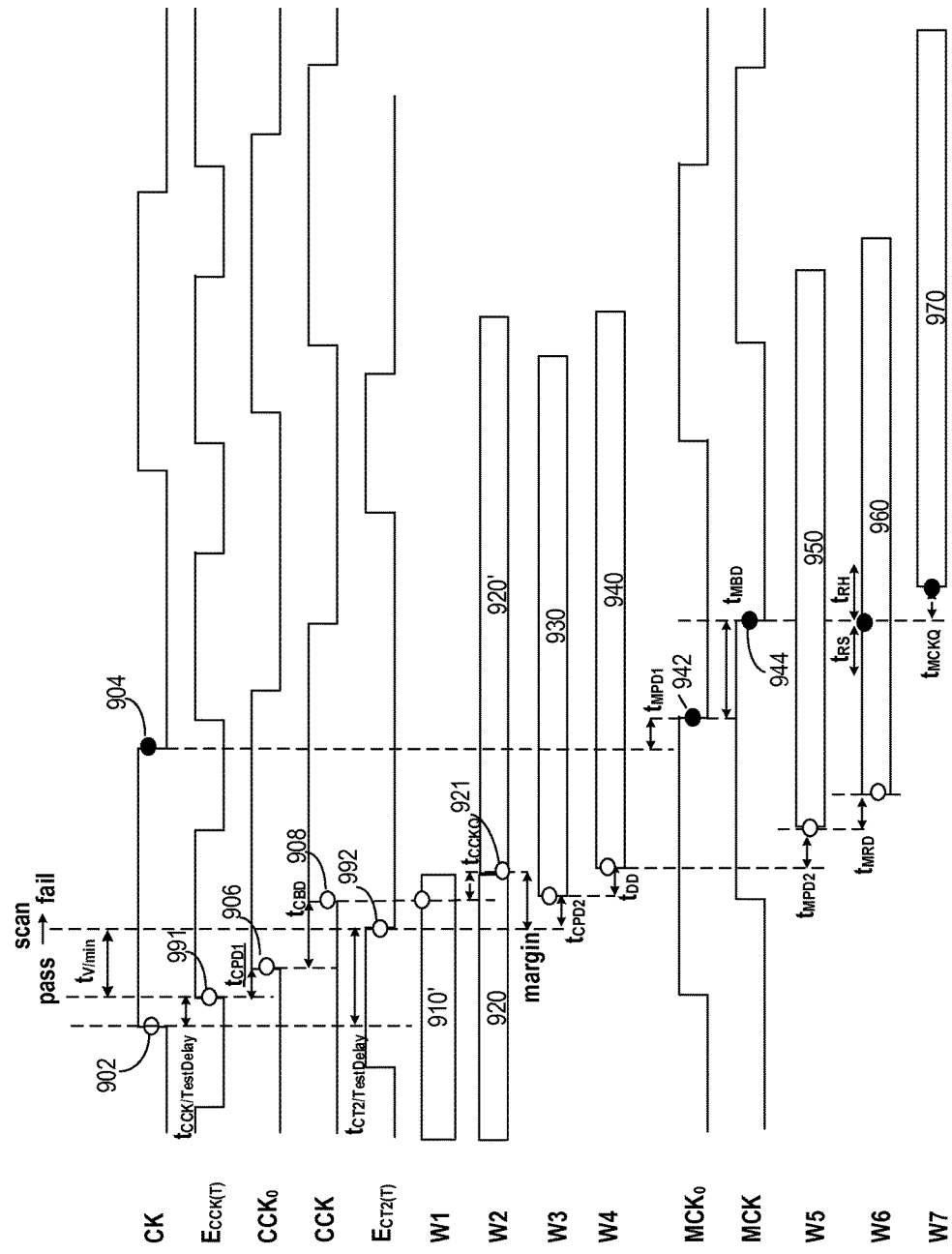

Referring to FIG. 9, a timing diagram illustrating one example of the testing of one embodiment of the write data transmit interface 116A with respect to the data valid time $t_V$ is shown. As shown in FIGS. 5 and 9, the controller clock latch 402 receives the clock signal CK from the global clock circuit 106 and the test signal $E_{CCK}$. The clock signal CK includes a rising edge 902 and a falling edge 904. The test signal $E_{CCK}$ defines a plurality of timing events, including a first timing event 991, which can be a rising (or falling) edge of the test signal $E_{CCK}$. The controller clock latch 402 transfers the clock CK in response to the timing event 991, thereby delaying the clock signal CK by a controller clock test delay $t_{CCK/TestDelay}$. The controller clock latch 402 itself also adds an additional controller pass-gate delay to $t_{CPD1}$ to the clock signal CK. The clock signal CK, after passing the controller clock latch 402 becomes clock signal $CCK_0$, which has a rising edge 906 delayed from the corresponding rising edge 902 the clock signal CK by an amount of time $t_{CCK/TestDelay} + t_{CPD1}$, as illustrated in FIG. 9. The controller clock latch 402 transmits the clock signal $CCK_0$ to the controller clock buffer 404.

The controller clock buffer 404 receives the clock signal $CCK_0$ and transmits it as clock signal CCK (controller clock signal) to the other interface circuits, including the write data transmit interface 116A. The controller clock buffer 404 adds a controller clock buffer delay $t_{BD}$ to the preliminary clock signal $CCK_0$ as the clock signal $CCK_0$ is processed by the controller clock buffer 404, so the controller clock signal CCK is delayed from the clock signal $CCK_0$ by a delay amount $t_{CBD}$, as illustrated in FIG. 9, which shows that the rising edge 902 of the clock signal $CCK_0$ is ahead of a corresponding rising edge 908 of the clock signal CCK by an amount of time $t_{CBD}$.

The write data transmit interface 116A receives write data W1 from the controller logic domain and the controller clock signal CCK from the controller clock interface 114. The write data W1 has a first portion in a first data valid time (not shown) and a second portion in a second data valid time 910'. The data transmit register 408A holds the received second portion of the write data W1 and transmits it as a second portion of write data W2 having a data valid time 920' in response to the rising edge 908 of the controller clock signal CCK. The data transmit register 408A adds a controller clock-to-output delay $t_{CCKQ}$ to the second portion write data so the start of the data valid time 920 associated with the write data W2 is delayed from the rising edge 908 of the controller clock CCK by the delay amount $t_{CCKQ}$, as shown in FIG. 9. The data transmit register 408A transmits the write data W2 to the data transmit latch 410A.

Prior to receiving the second portion of write data W1, the write data transmit interface 116A had received the first portion of write data W1 (not shown) from the controller logic domain. In one embodiment, the first portion of the write data W1 had a data valid time (not shown) proceeding the data valid time 910'. The data transmit register 408A had held the received first portion of the write data W1 and transmitted it as a first portion of write data W2 having a data valid time 920 in response to a prior rising edge (not shown) of the controller clock signal CCK. The data transmit register 408A had transmitted the first portion of the write data W2 to the data transmit latch 410A.

The data transmit latch 410A had received the first portion of the write data W2 from the data transmit register 408A and the test signal $E_{CT2}$ from the test signal generator 108. The test signal $E_{CT2}$ defines a plurality of timing events, including a second timing event 992, which is delayed from the rising edge 902 of the clock signal CK by an amount of time $t_{CT2/TestDelay}$, as shown in FIG. 9. If the time interval $\Delta t_3 = t_{CT2/TestDelay} - t_{CCK/TestDelay}$ between the first and second timing events 991 and 992 is set such that the second timing event occurs before the end 921 of the data valid time 920 of the first portion of the write data W2, the data transmit latch 410A would transfer the first portion of the write data signal W2 in response to the timing event 992.

As shown in FIG. 9, in one embodiment, to test whether Eq. (2) is valid, the time interval $\Delta t_3 = t_{CT2/TestDelay} - t_{CCK/TestDelay}$ between the first and second timing events is set to be equal to the timing parameter $t_{V/min}$. Thus, if the end of the data valid time 920 occurs after the second timing event 992 by a certain margin, the data transmit latch 410A would transfer the first portion of the write data W2 in response to the second timing event 992. The data transmit latch 410A itself also adds a controller pass-gate delay $t_{CPD2}$ to the write data as the write data passes through the data transmit latch 410A. The first portion of the write data W2 after passing the data transmit latch 410A becomes write data W3 having a data valid time 930, as shown in FIG. 9.

The data transmitter 412A receives the write data W3 from the data transmit latch 410A and transmits the write data as write data W4 having a data valid time 940 to the memory device 104. The data transmitter 412A adds a controller transmitter delay $t_{DD}$ to the write data, so write data W4 is delayed from the write data W3 by a delay amount $t_{DD}$, as illustrated in FIG. 9.

The test signals sent to the memory device 104 from the test signal generator are held asserted during this test. Therefore, the write data receive interface 118B should receive the write data W4 and process the write data similarly as discussed above with reference to FIG. 6A. Referring to FIG. 9, in the memory device 104, the memory clock latch 422B receives the clock signal CK from the global clock circuit 106 and adds a memory pass-gate delay $t_{MPD1}$ to the global clock signal CK as the clock signal CK passes through the memory clock latch 422 and is transmitted as preliminary memory clock signal $MCK_0$. The memory clock buffer 424 receives the preliminary memory clock signal $MCK_0$ and adds a memory clock buffer delay $y_{MBD}$ to the preliminary memory clock signal $MCK_0$ as the preliminary memory clock signal $MCK_0$ is processed by the memory clock buffer 424 and transmitted as the memory clock signal MCK.

In the data receive interface 118B, the data receive latch 416B receives the write data W4 from the memory controller 102 and adds a memory pass-gate delay $t_{MPD2}$ to the write data W4 as the write data W4 passes through the data receive latch 416B and is transmitted as the write data W5, with a data valid time 950. The data receiver 418B adds a memory receiver delay $t_{RD}$ to the write data W5 as the write data W5 passes through the data receiver 420B and is transmitted as the write data W6 (with a data valid time 960) to the data receive register 420B. The data receive register 420B receives write data W6 from the data receiver 418B and the memory clock signal MCK from the memory clock interface 124. The write data W6 is held by the data receive register 420B and is transmitted as write data W7 (with a data valid time 970) in response to falling edge 944 of the memory clock signal MCK. The data receive register 420B transmits the write data W7 to the memory core 122.

Therefore, whether the write data transmit interface 116A meets the criterion of Equation (4) is determined by whether the write data W7 output by the register 420B in response to the falling edge 944 of the memory clock MCK includes the same information as the first portion 920 of the write data W2.

In one embodiment, after determining that the end 921 of the data valid time 920 occurs after the second timing event 992, the "margin" by which the end of the data valid time 920 occurs after the second timing event 992 can be determined by sweeping the second timing event 992, starting from a position where the interval $\Delta t_3 = t_{CT2/TestDelay} - t_{CCK/TestDelay}$ is equal to (or smaller than) $t_V$ and moving toward the beginning 921 of the data valid time 920 of the write data W2. When the second timing event 992 moves past the data valid time 920 of the first portion of the write data W2, the data transmit latch 410A stops transferring the first portion of the write data W2 in response to the second timing event and the second timing event should coincide with the end of the data valid time 920

Testing of Receive Interface 118 for the Data Hold Time $t_H$

Figure 10A:
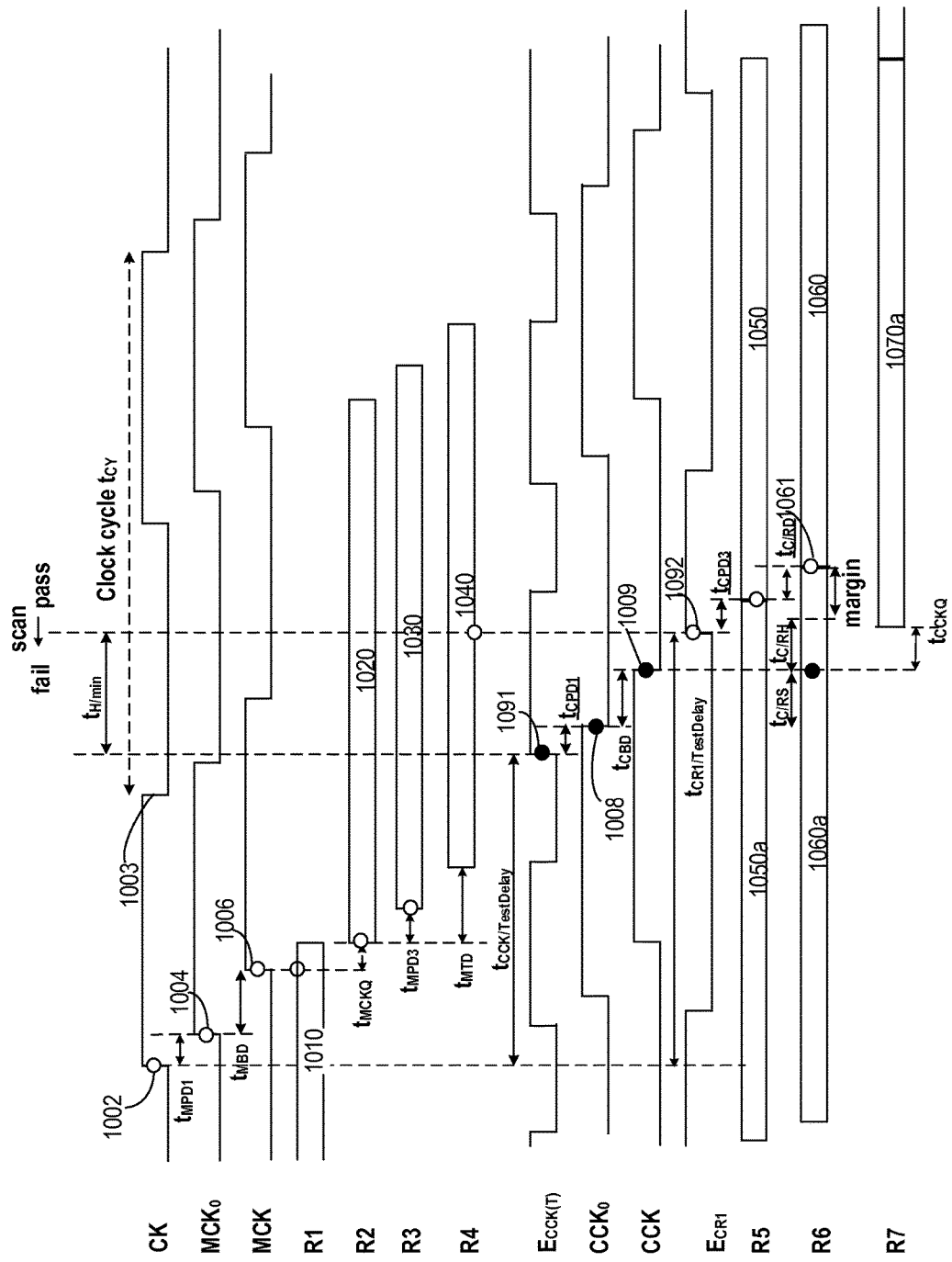

Referring to FIG. 10A, a timing diagram illustrating one example of the testing of one embodiment of the read data receive interface 118A with respect to the data hold $t_H$ is shown. As shown in FIGS. 5 and 10A, in the memory device 104, the memory clock latch 422B receives the clock signal CK from the global clock circuit 106 and the test signal $E_{MCK}$ from the test signal generator 108. The test signal $E_{MCK}$ is asserted, enabling the memory clock latch to transfer the clock signal CK. The enabled memory clock latch 422 adds a memory pass-gate delay $t_{MPD1}$ to the global clock signal CK as the clock signal CK passes through the memory clock latch 422 and is transmitted as preliminary memory clock signal $MCK_0$. The memory clock latch 422 transmits the preliminary memory clock signal $MCK_0$ to the memory clock buffer 424.

The memory clock buffer 424 receives the preliminary memory clock signal $MCK_0$ and transmits the memory clock signal MCK. The memory clock buffer 424 adds a memory clock buffer delay $t_{MBD}$ to the preliminary memory clock signal $MCK_0$ as the preliminary memory clock signal $MCK_0$ is processed by the memory clock buffer 424 and transmitted as the memory clock signal MCK. The memory clock buffer 424 transmits the memory clock signal MCK to the other interface circuits, such as the data transmit interface 116B.

In the data transmit interface 116B, the data transmit register 408B receives read data R1 having a data valid time 1010 from the memory core 122 and the memory clock signal MCK from the memory clock interface 124. The read data R1 is held by data transmit register 408B and is transmitted as read data R2 in response to the memory clock signal MCK. In one embodiment, the data transmit register 408 transmits the data R2 in response to a rising edge 1006 of the memory clock signal MCK. The data transmit register 408B adds a memory clock-to-output delay $t_{MCKQT}$ to the read data R2. So, the start of a data valid time 1020 of the read data R2 is delayed from the rising edge 609 of the clock signal MCK by the delay amount $t_{MCKQT}$, as shown in FIG. 10A. The data transmit register 408B transmits the read data R2 to the data transmit latch 410B.

The data transmit latch 410B receives the read data R2 from the data transmit register 408B and the test signal $E_{MT1}$ from the test signal generator 108. The test signal $E_{MT1}$ is asserted, enabling the data transmit latch 410B to transfer the read data. The enabled data transmit latch 410B adds a memory pass-gate delay $t_{MPD3}$ to the read data as the read data passes through the data transmit latch 410B and is transmitted as read data R3. So, the data valid time 1030 of the read data R3 is delayed from the data valid time 1020 of read data R2 by the delay amount $t_{MPD3}$, as shown in FIG. 10A. The data transmit latch 410 transmits the read data R3 to the data transmitter 412.

The data transmitter 412B receives the read data R3 from the data transmit latch 410B and transmits the read data to the memory controller 102 as read data R4. The data transmitter 412B adds a memory transmitter delay $t_{MTD}$ to the read data as the data R3 passes through the data transmitter 412B. So, the data valid time 1040 of the read data R4 is delayed from the data valid time 1030 of read data R3 by the delay amount $t_{MTD}$, as shown in FIG. 10A.

Still referring to FIGS. 5 and 10A, in the memory controller 102, the controller clock latch 402 receives the clock signal CK and the test signal $E_{CCK}$. The test signal $E_{CCK}$ defines a plurality of timing events, including a first timing event 1091, which can be a rising edge of the test signal $E_{CCK}$ and which is delayed from a corresponding rising edge 1002 of the clock signal CK by a controller clock test delay $t_{CCK/TestDelay}$. The controller clock latch 402 transfers the clock CK in response to the timing events, causing the clock signal CK to be delayed by the controller clock test delay $t_{CCK/TestDelay}$. The controller clock latch 402 itself also adds an additional controller pass-gate delay to $t_{CPD1}$ to the clock signal CK, and outputs the clock signal as clock signal $CCK_0$, which has a falling edge 1008 delayed from the corresponding rising edge 1002 of the clock signal CK by an amount of time $t_{CCK/TestDelay}+t_{CPD1}$, as illustrated in FIG. 10A. The controller clock latch 402 transmits the clock signal $CCK_0$ to the controller clock buffer 404.

The controller clock buffer 404 receives the preliminary controller clock signal $CCK_0$ and transmits it as the controller clock signal CCK to the other interface circuits, including the read data receive interface 118A. The controller clock buffer 404 adds a controller clock buffer delay $t_{CBD}$ to the preliminary controller clock signal $CCK_0$ as the preliminary controller clock signal $CCK_0$ is processed by the controller clock buffer 404, so the controller clock signal CCK is delayed from the preliminary controller clock signal $CCK_0$ by a delay amount $t_{CBD}$, as illustrated in FIG. 10A, which shows that the falling edge 1008 of the clock signal $CCK_0$ is ahead of a corresponding falling edge 1009 of the clock signal CCK by an amount of time $t_{CBD}$.

In the read data receive interface 118A, the data receive latch 416A receives the read data R4 from the memory device 104 and the test signal $E_{CR1}$ from the test signal generator 108. The test signal $E_{CR1}$ defines a plurality of timing events, including a second timing event 1092, which is delayed from the rising edge 1002 of the clock signal CK by an amount of time $t_{CR1/TestDelay}$, as shown in FIG. 10A. The data receive latch 416A transfers the read data signal R4 in response to the timing events in the test signal $E_{CR1}$ and adds a pass gate delay $t_{CPD2}$ to the write data. So, read data R5 output by the data receive latch 416A has a data valid time 1050 starting $t_{CPD2}$ after the second timing event 1092.

The data receiver 418A receives the read data R5 from the data receive latch 416A and transmits the read data R5 to the data receive register 420A. The data receiver 418A adds a controller receiver delay $t_{CRD}$ to the read data R5 as the read data R5 passes through the data receiver 418A and is transmitted as read data R6 to the data receive register 420A. So, the data valid time 1060 of the read data R6 is delayed from the data valid time 1050 of read data R5 by the delay amount $t_{CRD}$, as shown in FIG. 10A.

The data receive register 420A receives the read data R6 from the data receiver 418A and the controller clock signal CCK from the controller clock interface 114. The read data R6 is held by the data receive register 420A and is transmits by the data receive register 420A as read data R7 in response to the controller clock signal CCK. In one embodiment, the data receive register 420 transmits the data R7 in response to the falling edge 645 of the controller clock signal CCK. The data receive register 420A adds a controller clock-to-output delay $t_{CCKQR}$ to the data R7. So, the start of the data valid time 64 of the read data R7 is delayed from the falling edge 645 of the clock signal CCK by the delay amount $t_{CCKQR}$, as shown in FIG. 10A. The data receive register 420A transmits the read data R7 to the controller logic domain 112.

In one embodiment, to test the controller read data receive interface 118A for data hold time, the time interval $\Delta t_4 = t_{CR1/TestDelay} - t_{CCK/TestDelay}$ between the first and second timing events 1091 and 1092 is set to be the data sheet parameter $t_{H/min}$. Thus, the beginning of the data valid time 1060 or the end of a data valid time 1060a prior to the data valid time 1060 in read data R6 should lag the falling edge 1009 of the controller clock CCK by approximately $t_{H/min}$. The read data receive interface 118A meets the data hold time test if the information carried during the data valid time 1060a by the read data R6 is transferred by the data receive register 420A in response to the falling edge 1009 of the controller clock CK.

In one embodiment, after determining that the read data receive interface 118A meets the data hold time test, the "margin" by which the read data receive interface 118A meets the data hold time test can be determined by sweeping the second timing event 1092, starting from a position where $\Delta t_4$ is equal to (or larger than) $t_{H/min}$ and moving toward the first timing event 1091, as shown in FIG. 10A.

Testing of Receive Interface 118 for the Data Setup Time $t_S$

Figure 10B:
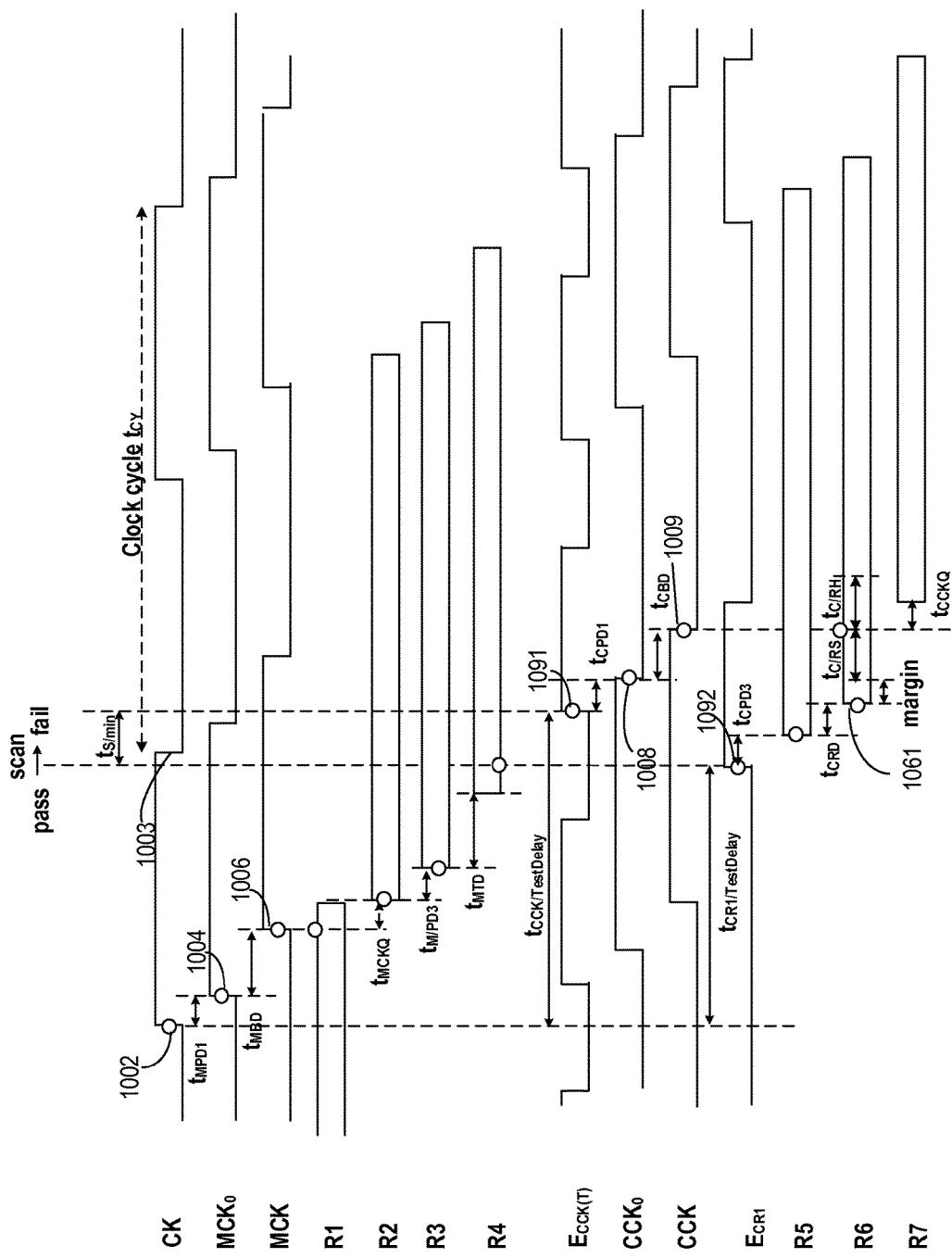

Referring to FIG. 10B, a timing diagram illustrating one example of the testing of one embodiment of the read data receive interface 118A with respect to the data hold $t_S$ is shown. As shown in FIGS. 5 and 10B, read data R1 is received from the memory core and passes through the read data transmit interface 116B in the memory device 104 similarly as discussed above with reference to FIG. 10A.

Referring to FIGS. 5 and 10B, in the memory controller 102, the controller clock latch 402 receives the clock signal CK and the test signal $E_{CCK}$. The test signal $E_{CCK}$ defines a plurality of timing events, including a first timing event 1091, which can be a rising edge of the test signal $E_{CCK}$ and which is delayed from a corresponding rising edge 1002 of the clock signal CK by a controller clock test delay $t_{CCK/TestDelay}$. The controller clock latch 402 transfers the clock CK in response to the timing events, causing the clock signal CK to be delayed by the controller clock test delay $t_{CCK/TestDelay}$. The controller clock latch 402 itself also adds an additional controller pass-gate delay to $t_{CPD1}$ to the clock signal CK, and outputs the clock signal as clock signal $CCK_0$, which has a falling edge 1008 delayed from the corresponding rising edge 1002 of the clock signal CK by an amount of time $t_{CCK/TestDelay}+t_{CPD1}$, as illustrated in FIG. 10B. The controller clock latch 402 transmits the clock signal $CCK_0$ to the controller clock buffer 404.

The controller clock buffer 404 receives the preliminary controller clock signal $CCK_0$ and transmits it as the controller clock signal CCK to the other interface circuits, including the read data receive interface 118A. The controller clock buffer 404 adds a controller clock buffer delay $t_{CBD}$ to the preliminary controller clock signal $CCK_0$ as the preliminary controller clock signal $CCK_0$ is processed by the controller clock buffer 404, so the controller clock signal CCK is delayed from the preliminary controller clock signal $CCK_0$ by a delay amount $t_{CBD}$, as illustrated in FIG. 10B, which shows that the falling edge 1008 of the clock signal $CCK_0$ is ahead of a corresponding falling edge 1009 of the clock signal CCK by an amount of time $t_{CBD}$.

In the read data receive interface 118A, the data receive latch 416A receives the read data R4 from the memory device 104 and the test signal $E_{CR1}$ from the test signal generator 108. The test signal $E_{CR1}$ defines a plurality of timing events, including a second timing event 1092, which is delayed from the rising edge 1002 of the clock signal CK by an amount of time $t_{CR1/TestDelay}$, as shown in FIG. 10B. The data receive latch 416A transfers the read data signal R4 in response to the timing events in the test signal $E_{CR1}$ and adds a pass gate delay $t_{CPD2}$ to the write data. So, read data R5 output by the data receive latch 416A has a data valid time 1050 starting $t_{CPD2}$ after the second timing event 1092.

The data receiver 418A receives the read data R5 from the data receive latch 416A and transmits the read data R5 to the data receive register 420A. The data receiver 418A adds a controller receiver delay $t_{CRD}$ to the read data R5 as the read data R5 passes through the data receiver 420 and is transmitted as read data R6 to the data receive register 420A. So, the data valid time 1060 of the read data R6 is delayed from the data valid time 1050 of read data R5 by the delay amount $t_{CRD}$, as shown in FIG. 10B.

The data receive register 420A receives the read data R6 from the data receiver 418A and the controller clock signal CCK from the controller clock interface 114. The read data R6 is held by the data receive register 420A and is transmits by the data receive register 420A as read data R7 in response to the controller clock signal CCK. In one embodiment, the data receive register 420 transmits the data R7 in response to the falling edge 645 of the controller clock signal CCK. The data receive register 420A adds a controller clock-to-output delay $t_{CCKQR}$ to the data R7. So, the start of the data valid time 64 of the read data R7 is delayed from the falling edge 645 of the clock signal CCK by the delay amount $t_{CCKQR}$, as shown in FIG. 10B. The data receive register 420A transmits the read data R7 to the controller logic domain 112.

In one embodiment, to test the controller read data receive interface 118A for data set time, the time interval $\Delta t_S = t_{CCK/TestDelay} - t_{CR1/TestDelay}$ between the first and second timing events 1091 and 1092 is set to be the data sheet parameter $t_{S/min}$. Thus, the beginning of the data valid time 1060 in read data R6 should lead the falling edge 1009 of the controller clock CCK by approximately $t_{S/min}$. The read data receive interface 118A meets the data set time test if the information carried during the data valid time 1060 by the read data R6 is transferred by the data receive register 420A in response to the falling edge 1009 of the controller clock CK.

In one embodiment, after determining that the read data receive interface 118A meets the data set time test, the "margin" by which the read data receive interface 118A meets the data set time test can be determined by sweeping the second timing event 1092, starting from a position where $\Delta t_S$ is equal to (or larger than) $t_{S/min}$ and moving toward the first timing event 1091, as shown in FIG. 10B.

Testing in Memory System Using Strobe Signals

Figure 11A:
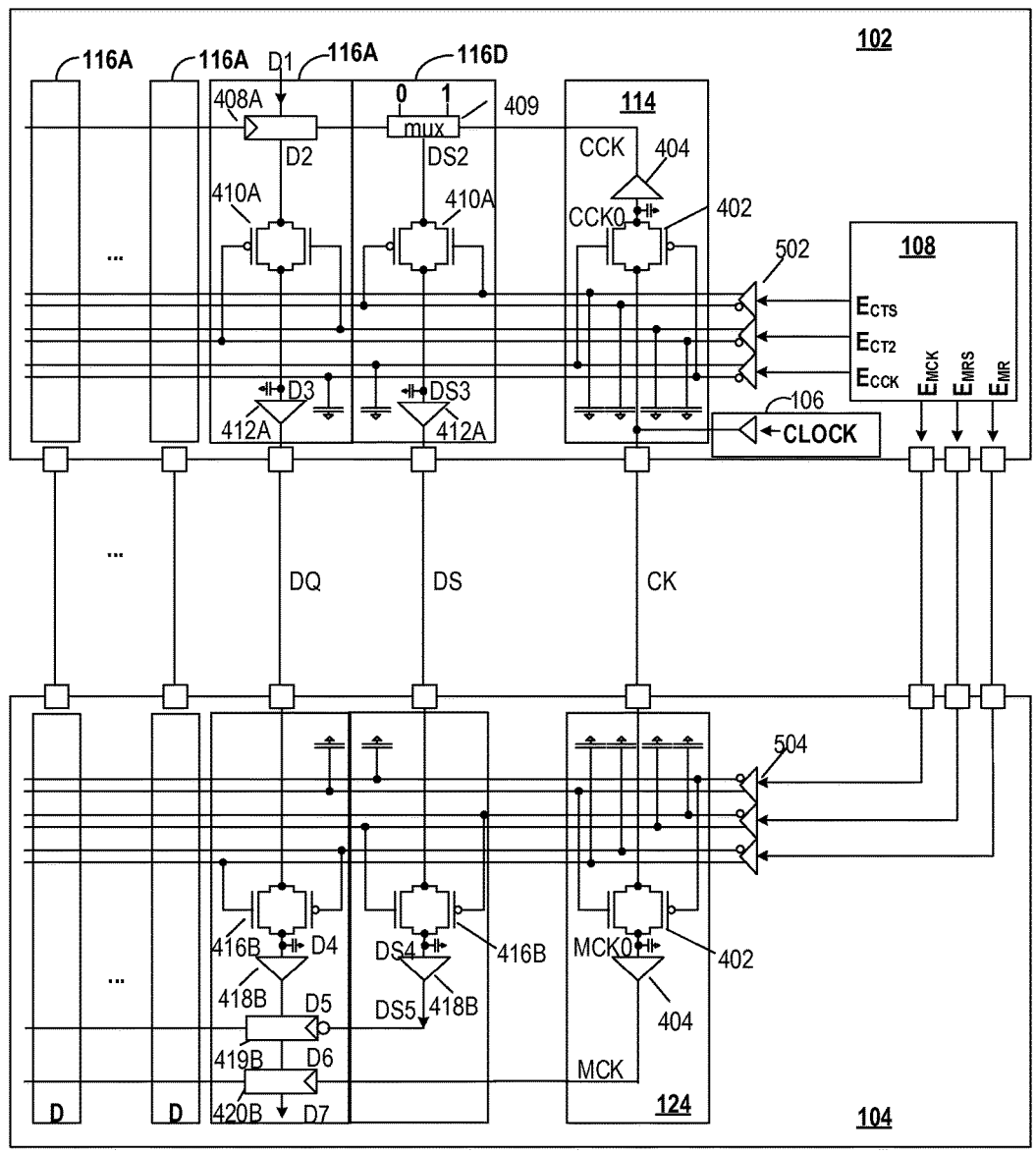
FIG. 11A is a circuit schematic diagram representation of one embodiment of some interface components in a memory system using strobe signals.
Figure 11B:
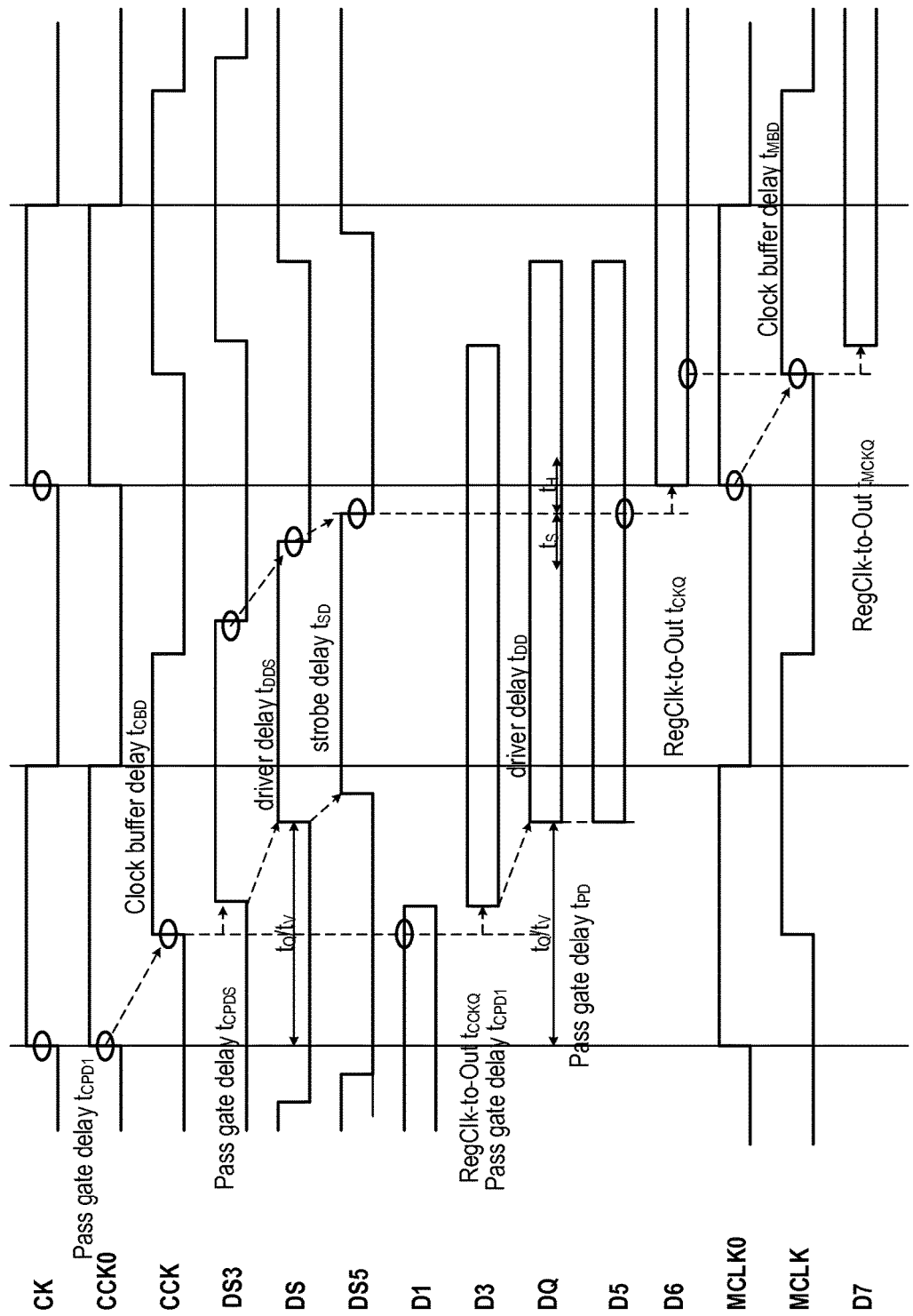
FIG. 11B is one example of a timing diagram illustrating timing paths in the interface circuits in the memory system of FIG. 11A.

In the embodiments discussed above, the CCK and MCK timing signals are derived from a global clock signal CK and are used to time the transmission and reception of command and data signals. In other embodiments, a strobe signal is used as timing signals accompanying a small group of data signals, as illustrated in FIGS. 11A and 11B. The above discussion can be easily modified to apply to the memory systems shown in FIG. 11A.

Figure 12:
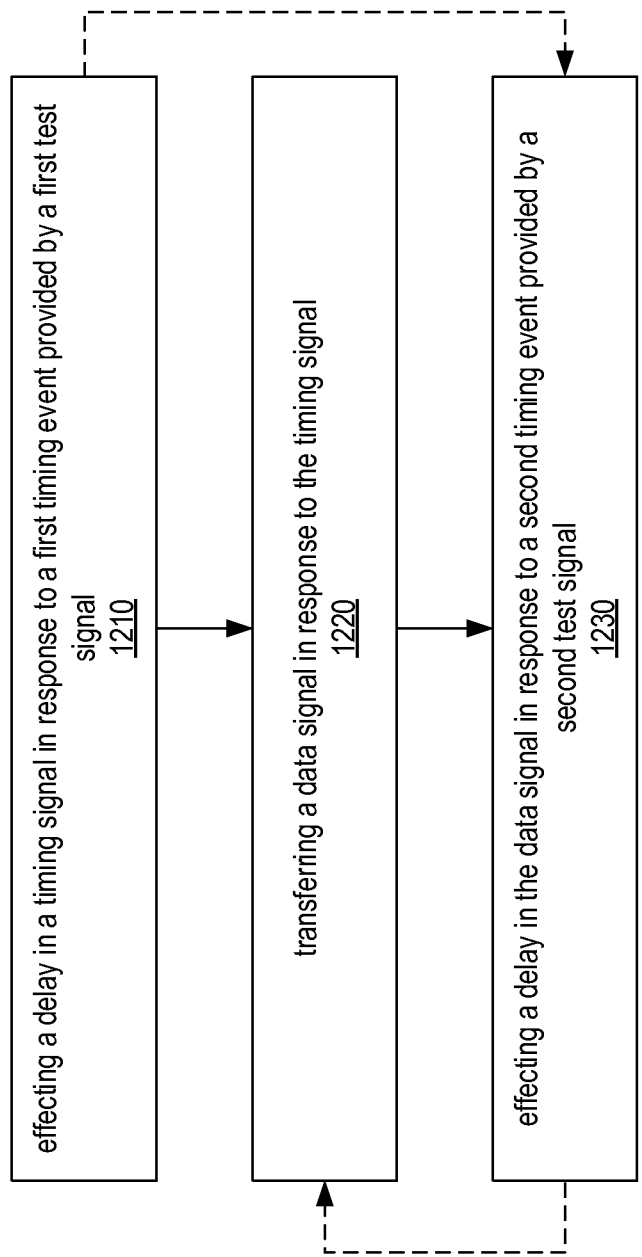
FIG. 12 is a flowchart illustrating one embodiment of a method for testing interface circuits in an integrated circuit.

FIG. 12 illustrates one embodiment of a method 1200 performed by an IC during testing. The method 1200 includes effecting a delay in a timing signal in response to a first timing event provided by a first test signal (1210), transferring a data signal in response to the timing signal (1220); and effecting a delay in the data signal in response to a second timing event provided by a second test signal (1230). In one embodiment, the second timing event is related to the first timing event according to a test criterion, as discussed above with respect to FIGS. 7 through 10B.

In one embodiment, effecting a delay in the data signal in response to a second timing event provided by the second test signal (1230) is performed by the IC after transferring the data signal in response to the timing signal (1220), as illustrated by the solid lines in FIG. 12 and by the timing diagrams in FIGS. 7, 8 and 9. In one embodiment, effecting a delay in the data signal in response to a second timing event provided by the second test signal (1230) is performed by the IC before transferring the data signal in response to the timing signal (1220), as illustrated by the dashed lines in FIG. 12 and by the timing diagrams in FIGS. 10A and 10B.

In one embodiment, the delay in the data signal is effected between transferring the data signal in response to the timing signal and communicating (transmitting or receiving) the data signal via a terminal of the IC. In one embodiment, the delay in the data signal is effected after transferring the data signal in response to the timing signal and before communicating the data signal via a terminal of the IC, as illustrated by the timing diagrams in FIGS. 7 and 8. In one embodiment, the delay in the data signal is effected after communicating the data signal via a terminal of the IC and before transferring the data signal in response to the timing signal, as illustrated by the timing diagrams in FIGS. 9, 10A and 10B.

A semiconductor IC device according to one embodiment of the present disclosure comprises terminals (pins) to be coupled to external signal lines, the terminals including a first terminal (e.g., a data pin) via which a data signal is communicated, a second terminal (e.g., a timing pin) via which a timing signal is communicated, and at least two third terminals (e.g., test pins) via which respective ones of at least two test signals are communicated. The semiconductor IC device further comprises a timing circuit coupled to the second terminal. The timing circuit is configured to receive a first test signal, which includes a first timing event, and to effect a delay in the timing signal in response to the first test signal. The IC device further comprises an interface circuit coupled to the data pin. The interface circuit is configured to transfer the data signal in response to the timing signal. The interface circuit is further configured to receive a second test signal and to effect a delay in the data signal in response to the second test signal. The second test signal includes a second timing event that is related to the first timing event according to a test criterion for testing the IC device with respect to a timing parameter. The timing parameter specifies a time interval between a data-event on a data pin and a timing-event on a timing pin.

In one embodiment, the IC device includes one or more first test-signal-wires to communicate the first test signal, and the timing circuit includes a first latch circuit coupled to the first test-signal-wire(s).

In one embodiment, the IC device includes one or more second test-signal-wires to communicate the second test signal, and the interface circuit includes a second latch circuit coupled to the second test-signal-wire(s).

In one embodiment, the first and second test signals create a test-interval between an event on the first test-signal-wire(s) and an event on the second test-signal-wire(s).

In one embodiment, the test-interval is made equal to a timing parameter specified for the component so that the IC device may be characterized and/or tested with respect to the timing parameter.

In one embodiment, the IC device includes a test signal generator that generates the first and second test signals. In one embodiment, the first and second test-signal-wires are matched in length and/or loading so that the test-interval is also imposed at the timing circuit and the interface circuit.

In one embodiment, the IC device is a first IC device directly attached to a second IC device. The test signals are generated in the second IC device and communicated to the first IC device via the test pins. In one embodiment, an IC system including the first and second IC devices further includes test-signal-wires to communicate the first and second test signals from the second IC device to the timing circuit and the interface circuit in the first IC device. In one embodiment, the entire test-signal-wires, including portions internal and external to the first IC device, are matched in length and loading so that the test-interval is imposed at the timing circuit and the interface circuit in the first IC device.

In one embodiment, the semiconductor IC device is a memory device or a memory controller device in a memory system where the semiconductor IC device is directly attached to another semiconductor IC device such that the first, second and third terminals are not directly accessible by external testing equipment.

Although a memory system including a memory device and a memory controller are used to illustrate testing of IC devices in a direct-attach configuration, the illustrations of the embodiments herein apply to IC devices and systems in general.

What is claimed is:

1. A system comprising:
   a test-signal generator to generate first and second test signals; and
   a semiconductor die having:
      a sequential element;
      a data contact pad to communicate an external data signal, the data contact pad selectively coupled to the sequential element to pass the external data signal between the sequential element and the data contact pad responsive to the first test signal to provide a delayed data signal; and
      a clock contact pad to communicate an external clock signal, the clock contact pad to selectively pass the external clock signal between the sequential element and the clock contact pad responsive to the second test signal to provide a delayed clock signal.

2. The system of claim 1, wherein the sequential element transmits the external data signal to the data contact pad via a data pass gate.

3. The system of claim 1, wherein the test-signal generator is instantiated on the semiconductor die.

4. A system comprising:
   a test-signal generator to generate first and second test signals; and
   a first semiconductor die having:
      a sequential element;
      a first data contact pad to communicate an external data signal, the first data contact pad selectively coupled to the sequential element to pass the external data signal between the sequential element and the first data contact pad responsive to the first test signal to provide a delayed data signal; and
      a first clock contact pad to communicate an external clock signal, the first clock contact pad to selectively pass the external clock signal between the sequential element and the first clock contact pad responsive to the second test signal to provide a delayed clock signal; and
   a second semiconductor die having:
      a second data contact pad bonded to the first data contact pad to communicate the external data signal; and
      a second clock contact pad bonded to the first clock contact pad to communicate the external clock signal.

5. The system of claim 4, the second semiconductor die including:
   a second sequential element, the second data contact pad to selectively pass the external data signal between the second sequential element and the second data contact pad responsive to a third test signal.

6. The system of claim 4, the second semiconductor die including:
   a second sequential element, the second clock contact pad to selectively pass the external clock signal between the second sequential element and the second clock contact pad responsive to a third test signal to provide a second delayed clock signal.

7. The system of claim 6, the second semiconductor die including:
   a data pass gate coupled between the second sequential element and the second data contact pad to selectively pass the external data signal between the second sequential element and the second data contact pad responsive to a fourth test signal.

8. The system of claim 7, the second semiconductor die further including first and second test pads to receive the third and fourth test signals.

* * * * *